(12) United States Patent
Iwamoto et al.

(10) Patent No.: US 12,185,449 B2
(45) Date of Patent: Dec. 31, 2024

(54) EUV LIGHT GENERATION APPARATUS, ELECTRONIC DEVICE MANUFACTURING METHOD, AND INSPECTION METHOD

(71) Applicant: Gigaphoton Inc., Tochigi (JP)

(72) Inventors: Fumio Iwamoto, Oyama (JP); Yutaka Shiraishi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 301 days.

(21) Appl. No.: 17/934,469

(22) Filed: Sep. 22, 2022

(65) Prior Publication Data

US 2023/0142875 A1 May 11, 2023

(30) Foreign Application Priority Data

Nov. 11, 2021 (JP) .................................. 2021-184363

(51) Int. Cl.
*H05G 2/00* (2006.01)
*G01N 21/88* (2006.01)
*G03F 7/00* (2006.01)

(52) U.S. Cl.
CPC ............ *H05G 2/006* (2013.01); *G01N 21/88* (2013.01); *G03F 7/70033* (2013.01); *G03F 7/70608* (2013.01); *H05G 2/008* (2013.01)

(58) Field of Classification Search
CPC .......... H05G 2/00; H05G 2/008; H05G 2/001; H05G 2/002; H05G 2/0027; H05G 2/005; H05G 2/0025; H05G 2/003; H05G 2/0088

See application file for complete search history.

(56) References Cited

U.S. PATENT DOCUMENTS

| 2010/0294953 A1 | 11/2010 | Vaschenko et al. |
| 2016/0044772 A1 | 2/2016 | Graham |
| 2017/0171955 A1 | 6/2017 | Jeno et al. |

FOREIGN PATENT DOCUMENTS

| JP | 2006-128157 A | 5/2006 | |
| WO | WO-2017130443 A1 * | 8/2017 | ............. H05G 2/006 |
| WO | 2019/185370 A1 | 10/2019 | |

OTHER PUBLICATIONS

Search Report issued by the Netherlands Patent Office on Jul. 2, 2024, which corresponds to Netherlands Patent Application 2033266 and is related to U.S. Appl. No. 17/934,469.

* cited by examiner

*Primary Examiner* — Don K Wong
(74) *Attorney, Agent, or Firm* — Studebaker & Brackett PC

(57) ABSTRACT

An EUV light generation apparatus to generate EUV light by irradiating a target with pulse laser light to turn the target into plasma includes a chamber, a target supply unit configured to supply the target to a plasma generation region in the chamber, a pulse laser device configured to generate pulse laser light to be radiated to the target, and a processor configured to change a generation frequency of the target generated by the target supply unit to a natural number multiple of an irradiation frequency of the pulse laser light based on a size of the target or related information related to the size of the target.

20 Claims, 24 Drawing Sheets

FIG. 9
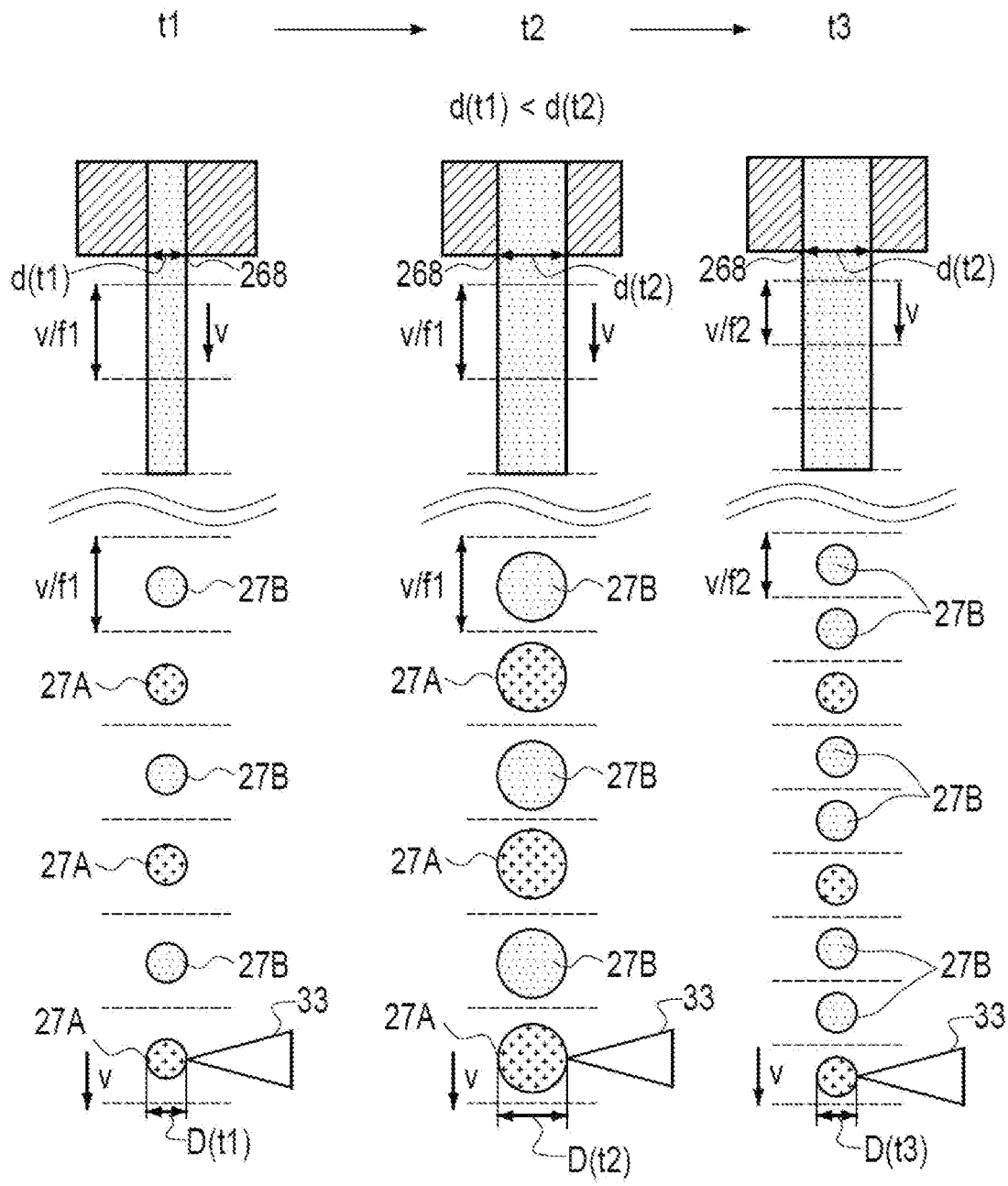
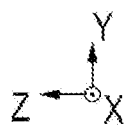

| REFERENCE NUMBER RN | REFERENCE TIME RX | GENERATION FREQUENCY f |
|---|---|---|
| RN1 | RX1 | f1 |
| RN2 | RX2 | f2 |
| RN3 | RX3 | f3 |
| ⋮ | ⋮ | ⋮ |
| RNk | RXk | fk |
| ⋮ | ⋮ | ⋮ |
| RNn | RXn | fn |

EUV LIGHT GENERATION APPARATUS, ELECTRONIC DEVICE MANUFACTURING METHOD, AND INSPECTION METHOD

CROSS-REFERENCE TO RELATED APPLICATIONS

The present application claims the benefit of Japanese Patent Application No. 2021-184363, filed on Nov. 11, 2021, the entire contents of which are hereby incorporated by reference.

BACKGROUND

1. Technical Field

The present disclosure relates to an EUV light generation apparatus, an electronic device manufacturing method, and an inspection method.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target substance with laser light has been developed.

LIST OF DOCUMENTS

Patent Documents

Patent Document 1: Japanese Patent Application Publication No. 2006-128157
Patent Document 2: US Patent Application Publication No. 2010/0294953
Patent Document 3: US Patent Application Publication No. 2017/0171955

SUMMARY

An EUV light generation apparatus according to an aspect of the present disclosure generates EUV light by irradiating a target with pulse laser light to turn the target into plasma. Here, the EUV light generation apparatus includes a chamber, a target supply unit configured to supply the target to a plasma generation region in the chamber, a pulse laser device configured to generate pulse laser light to be radiated to the target, and a processor configured to change a generation frequency of the target generated by the target supply unit to a natural number multiple of an irradiation frequency of the pulse laser light based on a size of the target or related information related to the size of the target.

An electronic device manufacturing method according to an aspect of the present disclosure includes generating EUV light as turning a target into plasma by irradiating the target with pulse laser light using an EUV light generation apparatus, outputting the EUV light to an exposure apparatus, and exposing a photosensitive substrate to the EUV light in the exposure apparatus to manufacture an electronic device. Here, the EUV light generation apparatus includes a chamber, a target supply unit configured to supply the target to a plasma generation region in the chamber, a pulse laser device configured to generate the pulse laser light to be radiated to the target, and a processor configured to change a generation frequency of the target to a natural number multiple of an irradiation frequency of the pulse laser light based on a size of the target.

An inspection method according to an aspect of the present disclosure includes generating EUV light as turning a target into plasma by irradiating the target with pulse laser light using an EUV light generation apparatus, outputting the EUV light to an inspection apparatus as a light source for inspection, and exposing a mask to the EUV light to inspect the mask in the inspection apparatus. Here, the EUV light generation apparatus includes a chamber, a target supply unit configured to supply the target to a plasma generation region in the chamber, a pulse laser device configured to generate the pulse laser light to be radiated to the target, and a processor configured to change a generation frequency of the target to a natural number multiple of an irradiation frequency of the pulse laser light based on a size of the target.

BRIEF DESCRIPTION OF THE DRAWINGS

Embodiments of the present disclosure will be described below merely as examples with reference to the accompanying drawings.

FIG. 9 is a schematic diagram of a case in which the generation frequency is increased when the diameter of the target is increased due to an increase in the diameter of the nozzle hole.

DESCRIPTION OF EMBODIMENTS

Figure 1:
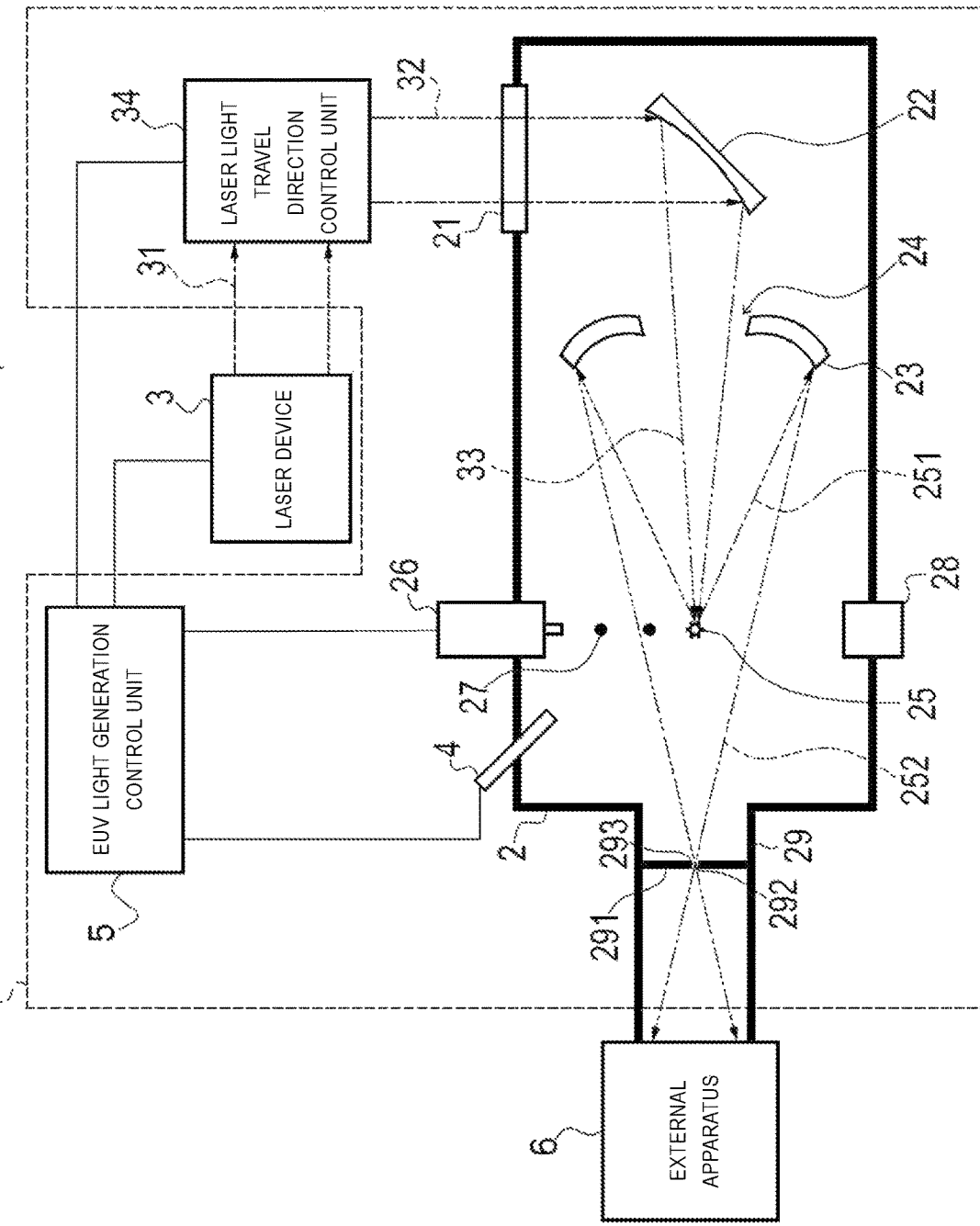
FIG. 1 is a diagram schematically showing the configuration of an LPP EUV light generation apparatus.

<Content>
1. Overall description of EUV light generation system
    1.1 Configuration
    1.2 Operation
2. EUV light generation apparatus according to comparative example
    2.1 Configuration
    2.2 Operation
    2.3 Problem
3. EUV light generation apparatus of first embodiment
    3.1 Configuration
    3.2 Operation
    3.3 Effects
4. EUV light generation apparatus of second embodiment
    4.1 Configuration
    4.2 Operation
    4.3 Effects
5. EUV light generation apparatus of third embodiment
    5.1 Configuration
    5.2 Operation
    5.3 Effects
6. EUV light generation apparatus of fourth embodiment
    6.1 Configuration
    6.2 Operation
    6.3 Effects
7. EUV light generation apparatus of fifth embodiment
    7.1 Configuration
    7.2 Operation
    7.3 Effects
8. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overall Description of EUV Light Generation System 1.1 Configuration

FIG. 1 schematically shows the configuration of an LPP EUV light generation system 11. An EUV light generation apparatus 1 is used with at least one pulse laser device (hereinafter, simply called a laser device) 3. In the present disclosure, a system including the EUV light generation apparatus 1 and the laser device 3 is referred to as the EUV light generation system 11. As shown in FIG. 1 and described in detail below, the EUV light generation apparatus 1 includes a chamber 2 and a target supply unit 26. The chamber 2 is configured sealable. The target supply unit 26 is attached, for example, to penetrate through a wall of the chamber 2. The material of the target 27 output from the target supply unit 26 includes tin. The material of the target 27 may also include a combination of tin and terbium, gadolinium, lithium, or xenon. The target 27 has a droplet shape.

At least one through hole is formed in the wall of the chamber 2. The through hole is provided with a window 21. Pulse laser light 32 output from the laser device 3 passes through the window 21. For example, an EUV light concentrating mirror 23 having a spheroidal reflection surface is arranged in the chamber 2. The EUV light concentrating mirror 23 has first and second focal points. A multilayer reflection film in which, for example, molybdenum and silicon are alternately stacked is formed on a surface of the EUV light concentrating mirror 23. The EUV light concentrating mirror 23 is arranged, for example, such that the first focal point is located in a plasma generation region 25 and the second focal point is located at an intermediate focal point (IF) 292. A through hole 24 is formed at the center of the EUV light concentrating mirror 23. Pulse laser light 33 passes through the through hole 24.

Further, the EUV light generation apparatus 1 includes an EUV light generation processor 5, a target sensor 4, and the like. The target sensor 4 has an imaging function to image the target 27 and output a target image TP, and detects the presence, trajectory, position, velocity, and the like of the target 27.

Further, the EUV light generation apparatus 1 includes a connection portion 29 providing communication between the inside of the chamber 2 and the inside of an external apparatus 6. A wall 291 in which an aperture 293 is formed is arranged in the connection portion 29. The wall 291 is arranged such that the aperture 293 is located at the second focal point of the EUV light concentrating mirror 23.

Further, the EUV light generation apparatus 1 includes a laser light travel direction control unit 34, a laser light concentrating mirror 22, a target collection unit 28 for collecting the target 27, and the like. The laser light travel direction control unit 34 includes an optical element for defining the travel direction of the laser light, and an actuator for adjusting the position, posture, and the like of the optical element.

1.2 Operation

As shown in FIG. 1, the pulse laser light 31 output from the laser device 3 passes through the window 21 through the laser light travel direction control unit 34 and enters the chamber 2 as the pulse laser light 32. The pulse laser light 32 travels along at least one optical path in the chamber 2, is reflected by the laser light concentrating mirror 22, and is radiated to at least one target 27 as the pulse laser light 33.

The target supply unit 26A outputs the target 27 toward the plasma generation region 25 in the chamber 2. The target 27 is irradiated with at least one pulse included in the pulse laser light 33. The target 27 irradiated with the pulse laser light 33 is turned into plasma, and radiation light 251 is radiated from the plasma. The EUV light concentrating mirror 23 reflects EUV light 252 contained in the radiation light 251 at higher reflectance than light in other wavelength ranges. The EUV light 252 reflected by the EUV light concentrating mirror 23 is concentrated at the intermediate focal point 292 and output to an external apparatus 6. Here, one target 27 may be irradiated with a plurality of pulses included in the pulse laser light 33.

The EUV light generation processor 5 controls the entire EUV light generation system 11. The EUV light generation processor 5 processes the image data or the like of the target 27 output by the target sensor 4. Further, the EUV light generation processor 5 controls, for example, the timing at which the target 27 is output, the output direction of the target 27, and the like. Furthermore, the EUV light generation processor 5 controls, for example, the oscillation timing of the laser device 3, the travel direction of the pulse laser light 32, the light concentration position of the pulse laser light 33, and the like. The above-described various kinds of control are merely examples, and other control may be added as necessary.

2. EUV Light Generation Apparatus According to Comparative Example

2.1 Configuration

Figure 2:
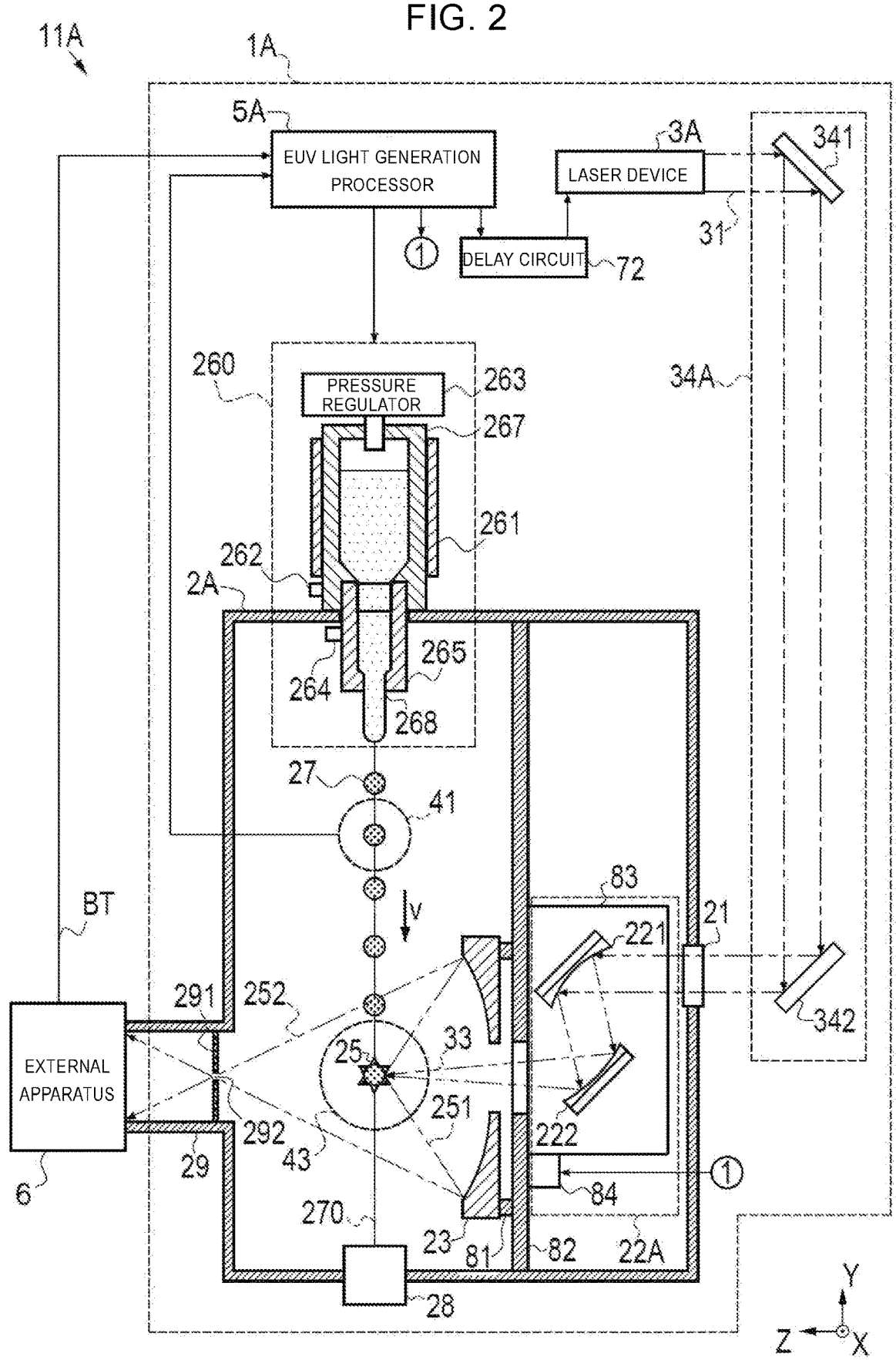
FIG. 2 is a sectional view showing the configuration of an EUV light generation apparatus according to a comparative example.
Figure 3:
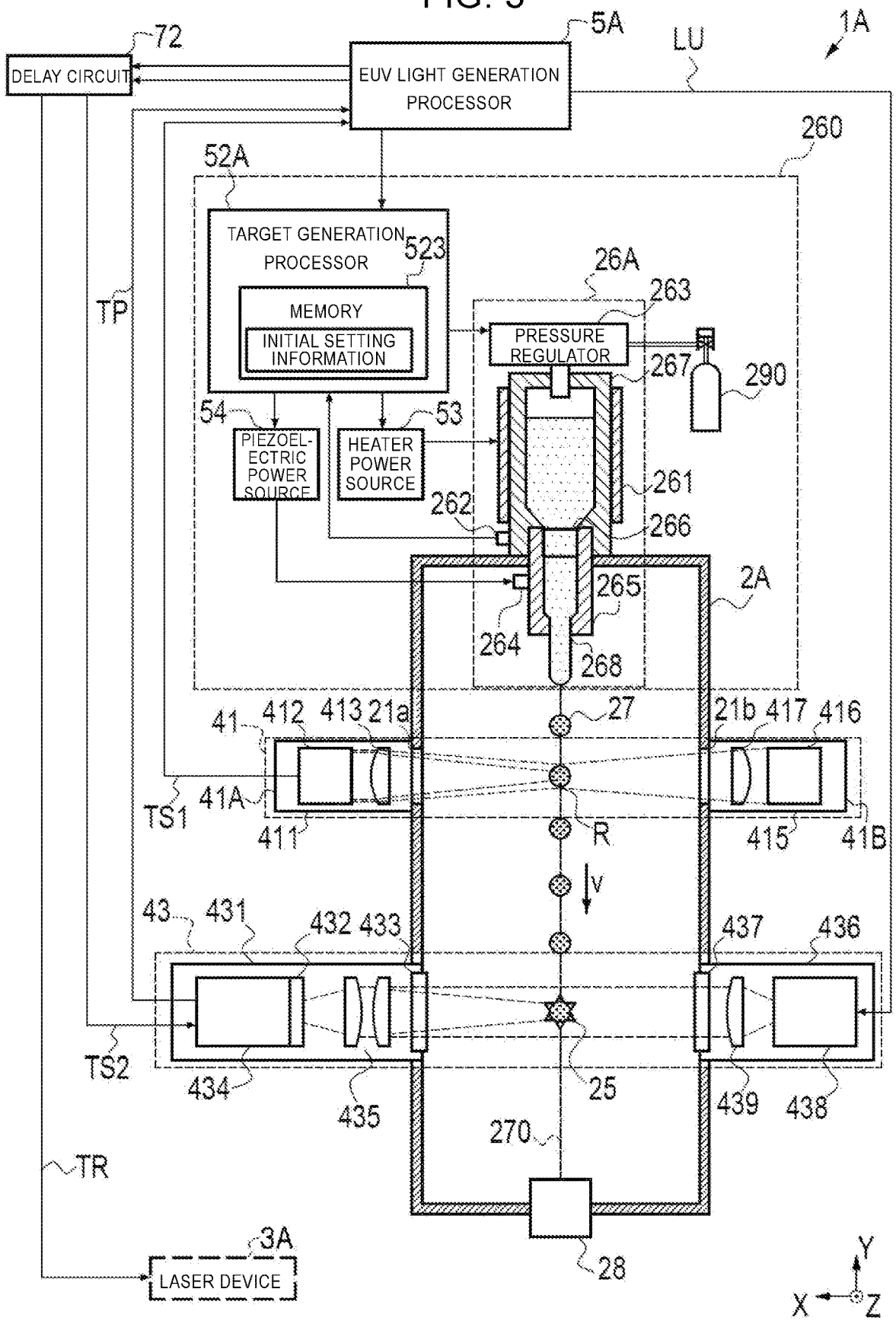
FIG. 3 is a sectional view of the EUV light generation apparatus when viewed from a different point of view from FIG. 2.

FIG. 2 is a sectional view showing the configuration of an EUV light generation apparatus 1A according to a comparative example. FIG. 3 is a sectional view of the EUV light generation apparatus 1A when viewed from a different point of view from FIG. 2. In FIGS. 2 and 3, the output direction of the EUV light is represented by the Z direction, and the direction opposite to the output direction of the target 27 is represented by the Y direction. The direction perpendicular to both the Z direction and the Y direction is represented by the X direction. FIG. 2 shows the EUV light generation apparatus 1A viewed in the X direction. FIG. 3 is a sectional view showing the EUV light generation apparatus 1A viewed in the Z direction and arrangement of a target generation system 260, a target detection unit 41, and an image measurement unit 43.

The EUV light generation apparatus 1A includes an EUV light generation processor 5A, a delay circuit 72, a chamber 2A, the target generation system 260, a laser light travel direction control unit 34A, the target detection unit 41, and the image measurement unit 43. The target detection unit 41 and the image measurement unit 43 configure the target sensor 4 shown in FIG. 1.

A light concentrating unit 22a, the EUV light concentrating mirror 23, the target collection unit 28, an EUV light concentrating mirror holder 81, plates 82, 83, a stage 84, and the connection portion 29 are provided in the chamber 2A.

The plate 82 is fixed to the chamber 2A. The plate 83 is supported by the plate 82. The light concentrating unit 22A includes a laser light concentrating mirror 221 and a laser light concentrating mirror 222.

The stage 84 is capable of adjusting the position of the plate 83 with respect to the plate 82. By adjusting the position of the plate 83, the positions of the laser light concentrating mirror 221 and the laser light concentrating mirror 222 are adjusted. The positions of the laser light concentrating mirror 221 and the laser light concentrating mirror 222 are adjusted so that the pulse laser light 33 reflected by these mirrors is concentrated at the plasma generation region 25.

The EUV light concentrating mirror 23 is fixed to the plate 82 via the EUV light concentrating mirror holder 81.

The laser device 3A may be a master oscillator power amplifier (MOPA) system. The laser device 3A is configured to output pulse laser light 31. The laser device 3A may include a master oscillator (not shown), an optical isolator (not shown), and a plurality of $CO_2$ laser amplifiers (not shown). A solid-state laser device may be employed as the master oscillator. The wavelength of the pulse laser light 31 output from the master oscillator is, for example, 10.59 μm, and the repetition frequency of the pulse oscillation is, for example, 100 kHz.

The laser light travel direction control unit 34A is arranged on the optical path of the pulse laser light 31 so as to reflect the pulse laser light 31 reflected by the high reflection mirrors 341, 342 toward the inside of the chamber 2A.

As shown in FIGS. 2 and 3, the target generation system 260 includes the target generation processor 52A, the target supply unit 26A, an inert gas supply unit 290, a heater power source 53, and a piezoelectric power source 54.

The target generation processor 52A controls the target generation system 260. The target generation processor 52A is, for example, a processing device including a storage device in which a control program is stored and a central processing unit (CPU) that executes the control program. The target generation processor 52A is specifically configured or programmed to perform various processes.

The target generation processor 52A includes a memory 523 as the storage device, and initial setting information is stored in the memory 523. The initial setting information includes various setting information such as a pressure value for controlling the inert gas supply unit 290, temperature information for controlling the heater power source 53, and a drive frequency for controlling the piezoelectric power source 54. The target generation processor 52A controls each unit of the target generation system 260 based on the initial setting information. The initial setting information may be stored in the memory 523 in advance or may be input from the EUV light generation processor 5A. Further, the initial setting information may be stored in a storage device outside the target generation processor 52A. Note that the EUV light generation processor 5A is also similar to the target generation processor 52A in being configured by a processing device including a storage device and a CPU.

The target supply unit 26A includes a reservoir 267, a heater 261, a temperature sensor 262, a pressure regulator 263, a piezoelectric element 264, a nozzle 265, and a filter 266.

The reservoir 267 stores the material of the target 27. The heater 261 used for melting the material of the target 27 and the temperature sensor 262 for measuring the temperature of the reservoir 267 are fixed to the reservoir 267. The output signal output from the temperature sensor 262 is input to the target generation processor 52A. The target generation processor 52A outputs a drive signal to the heater power source 53 based on the signal output from the temperature sensor 262.

The nozzle 265 has a nozzle hole 268 through which the molten material of the target 27 in the reservoir 267 is output. The target supply unit 26A is attached to the chamber 2A such that the nozzle hole 268 of the nozzle 265 is arranged inside the chamber 2A. The filter 266 is arranged on the upstream side of the nozzle 265 and removes impurities contained in the material of the target 27. Hereinafter, the material of the target 27 may be referred to as a target substance.

The pressure regulator 263 is installed on a pipe between the inert gas supply unit 290 and the reservoir 267 so as to regulate the pressure of the inert gas supplied from the inert gas supply unit 290 into the reservoir 267. The pressure regulator 263 is connected to the target generation processor 52A. When the pressure is applied to the reservoir 267, the target substance is output from the nozzle 265.

A piezoelectric element 264 is arranged at the nozzle 265 in the vicinity of the nozzle hole 268. The piezoelectric element 264 is connected to the piezoelectric power source 54 that supplies drive force to the piezoelectric element 264. The target generation processor 52A inputs an electric signal corresponding to the set drive frequency to the piezoelectric element 264 via the piezoelectric power source 54. The piezoelectric element 264 vibrates in response to the input electric signal. The vibration of the piezoelectric element 264 is transmitted to the nozzle 265, and the nozzle 265 vibrates. Although the vibration frequency of the nozzle 265 and the drive frequency of the piezoelectric element 264 are not accurately the same, they have a positive correlation, and the vibration frequency of the nozzle 265 increases as the drive frequency of the piezoelectric element 264 increases.

The vibration frequency of the nozzle 265 defines the generation frequency f of the target 27. The plurality of targets 27 are periodically supplied to the plasma generation region 25 at intervals. The generation frequency f of the target 27 is the number of targets 27 generated by the target supply unit 26A and supplied to the plasma generation region 25 per unit time. Although the vibration frequency of the nozzle 265 and the generation frequency f are not accurately the same as well, they have a positive correlation, and the generation frequency f increases as the vibration frequency of the nozzle 265 increases.

The target supply unit 26 includes an XZ stage (not shown). The EUV light generation processor 5A adjusts a trajectory 270 of the target 27 (hereinafter referred to as the target trajectory 270) so that the target 27 passes through the plasma generation region 25 under the control of the XZ stage.

The target detection unit 41 is attached to the chamber 2A. The target detection unit 41 is a sensor for detecting the target 27 passing through a target detection region R. The target detection region R is a predetermined region in the chamber 2A, and is a region located at a predetermined position on the target trajectory 270 between the target supply unit 26A and the plasma generation region 25.

As shown in FIG. 3, the target detection unit 41 includes a light receiving unit 41A and a light emitting unit 41B. The light receiving unit 41A includes a container 411, an optical sensor 412, and a light receiving optical system 413. The light emitting unit 41B includes a container 415, a light source 416, and an illumination optical system 417. The light emitting unit 41B illuminates the target 27 passing through the target detection region R. Unlike a pulse laser, the light source 416 is a continuous wave (CW) laser in which the output of the laser does not change with time and is output at a constant value. The illumination optical system 417 includes a cylindrical lens. The illumination light output from the light source 416 is concentrated by the illumination optical system 417. The concentration position of the illumination optical system 417 is preferably on the target trajectory 270. More specifically, as shown in FIG. 3, the illumination light once narrowed down is diffracted and spread by illuminating the target 27. It is preferable that the position of the beam waist at which the light flux of the illumination light is most narrowed overlaps with the target detection region R.

The light receiving unit 41A and the light emitting unit 41B are attached to a window 21a and a window 21b which are arranged on opposite sides of the target trajectory 270, respectively. The window 21a and the window 21b are provided at the chamber 2A.

In the light receiving unit 41A, the illumination light from the light emitting unit 41B is concentrated by the light receiving optical system 413, and received by the optical sensor 412. The optical sensor 412 is configured by a photoelectric conversion element such as a photodiode, and outputs a light receiving signal having a signal intensity corresponding to the amount of received light. When the target 27 passes through the target detection region R, the output of the optical sensor 412 varies. The light receiving unit 41A outputs a passage timing signal T1 indicating passage of the target 27 based on the variation in the output of the optical sensor 412.

The image measurement unit 43 is arranged on the downstream side of the target detection unit 41 in the travel direction of the target 27. The image measurement unit 43 is attached to a wall portion of the chamber 2A in the vicinity of the plasma generation region 25. The image measurement unit 43 images the target 27 supplied to the plasma generation region 25, and outputs the target image TP. The image measurement unit 43 includes a light source unit 436 and an imaging unit 431. The light source unit 436 and the imaging unit 431 are arranged to face each other across the plasma generation region 25 on the target trajectory 270. The direction in which the light source unit 436 and the imaging unit 431 face each other is perpendicular to the target trajectory 270.

The light source unit 436 outputs pulse light for imaging the target 27 that has reached the plasma generation region 25. The light source unit 436 includes a window 437, a light source 438, and an illumination optical system 439. The light source 438 may be, for example, a light source for pulse lighting such as a xenon flash lamp or a laser light source. The light source 438 is connected to the EUV light generation processor 5A. A lighting signal LU output from the EUV light generation processor 5A is input to the light source 438. The light source 438 emits pulse light based on the input lighting signal LU.

The illumination optical system 439 is an optical system including, for example, a collimator lens. The collimator lens collimates the pulse light emitted from the light source 438. The illumination optical system 439 guides the pulse light emitted from the light source 438 to the plasma generation region 25 on the target trajectory 270 via the window 437. When the target 27 that has reached the plasma generation region 25 is irradiated with the pulse light, a portion of the pulse light is blocked and a projection image of the target 27 is projected onto the imaging unit 431.

The imaging unit 431 images the projection image of the target 27. The imaging unit 431 includes a window 433, an image sensor 434, and a transfer optical system 435. Pulse light including the projection image of the target 27 is incident on the transfer optical system 435 in the imaging unit 431 via the window 433. The transfer optical system 435 includes, for example, a plurality of lenses. The transfer optical system 435 forms the projection image of the target 27 on a light receiving surface of the image sensor 434.

The image sensor 434 is a two dimensional image sensor such as a CCD. The image sensor 434 outputs an image signal corresponding to the projection image of the target 27 formed on the light receiving surface. The image sensor 434 includes a shutter 432. The shutter 432 may be an electrical shutter or a mechanical shutter. An imaging timing signal TS2 output from the EUV light generation processor 5A is input to the imaging unit 431 via the delay circuit 72. Opening and closing of the shutter 432 are controlled by the imaging timing signal TS2. The image sensor 434 images only while the shutter 432 is open. Operations of the imaging unit 431 and the light source unit 436 are synchronized by the imaging timing signal TS2 and the lighting signal LU.

The EUV light generation processor 5A controls the irradiation timing of the laser device 3 such that the target 27 that has reached the plasma generation region 25 is irradiated with the pulse laser light 33. Upon receiving a passage timing signal TS1 from the target detection unit 41, the EUV light generation processor 5A outputs, to the laser device 3, a light emission trigger signal TR that defines the irradiation timing. The delay circuit 72 delays the light emission trigger signal TR input from the EUV light generation processor 5A by a delay time required for the target 27 to reach the plasma generation region 25 from the target detection region R, and outputs the delayed light emission trigger signal TR. Thus, the target 27 that has reached the plasma generation region 25 is irradiated with the pulse laser light 33.

Further, upon receiving the passage timing signal TS1 from the target detection unit 41, the EUV light generation processor 5A outputs the imaging timing signal TS2 to the imaging unit 431. The delay circuit 72 delays the imaging timing signal TS2 input from the EUV light generation processor 5A by the above-described delay time and outputs the delayed imaging timing signal TS2. Thus, the imaging unit 431 can image a projection image of the target 27 at a timing when the target 27 has reached the plasma generation region 25.

The EUV light generation processor 5A receives a burst signal BT from the external apparatus 6 shown in FIG. 2. The burst signal BT is a signal from the external apparatus 6 to request the EUV light generation apparatus 1 to generate and stop EUV light. The EUV light generation processor 5A generates EUV light while the burst signal BT is on and stops generating EUV light while the burst signal BT is off.

2.2 Operation

Figure 4:
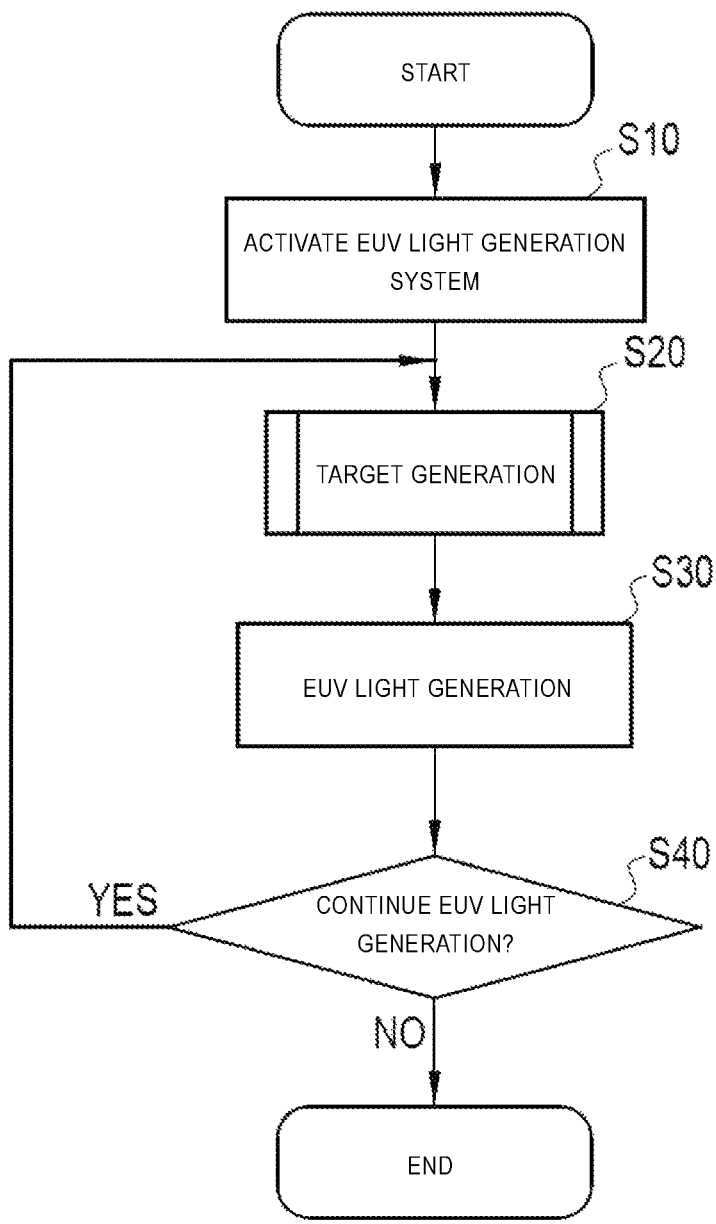
FIG. 4 is a main flowchart showing the operation of the EUV light generation system.
Figure 5:
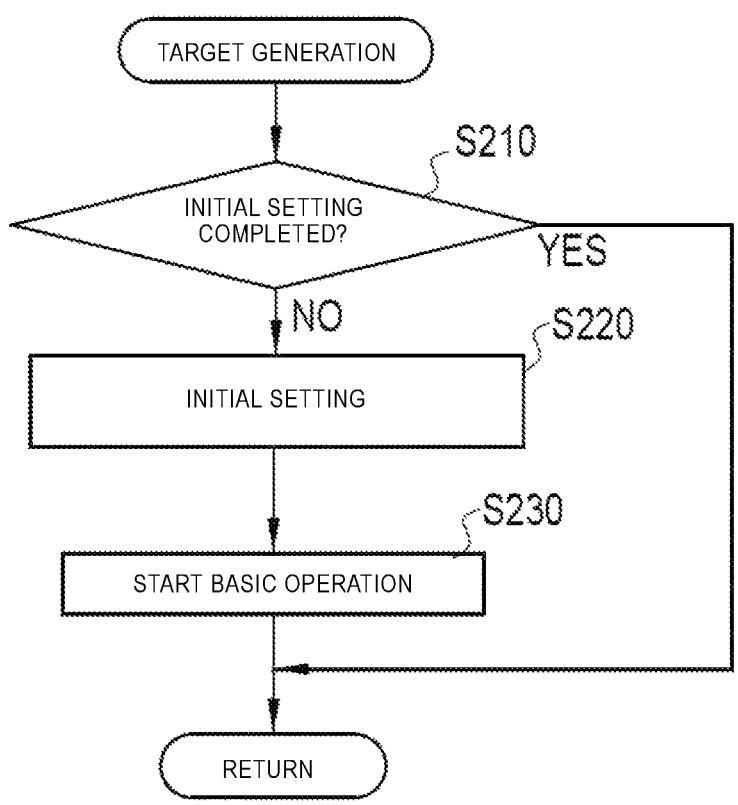
FIG. 5 is a flowchart showing a target generation process shown in FIG. 4.

FIG. 4 is a main flowchart showing the operation of an EUV light generation system 11A. FIG. 5 is a flowchart showing a target generation process shown in FIG. 4.

In step S10 of FIG. 4, when an activation instruction is input, the EUV light generation processor 5A activates the EUV light generation system 11A. After the activation, the EUV light generation processor 5A outputs a start signal for starting target generation to the target generation processor 52A.

In step S20, the target generation processor 52A starts target generation when the start signal from the EUV light generation processor 5A is input.

In step S30, the target generation processor 52A starts EUV light generation. Specifically, the target generation processor 52A operates the laser device 3 to start radiation of the pulse laser light 33 with respect to the target 27. When the target 27 is irradiated with the pulse laser light 33, the target 27 is turned into plasma, and EUV light 252 is generated. The EUV light 252 is output to the external apparatus 6. The pulse laser light 33 has a pulse time width on the picosecond order, for example. The picosecond order means the range of 1 ps or more and less than 1 ns. The pulse laser light 33 may have a pulse time width of 1 ns or more and less than 1 µs.

The target generation in step S20 is performed according to the flowchart shown in FIG. 5. First, in step S210, the target generation processor 52A determines whether or not the initial setting has been completed. When the initial setting is not completed (NO in step S210), processing proceeds to the initial setting in step S220.

In step S220, the target generation processor 52A performs the initial setting based on initial setting information stored in the memory 523. The initial setting includes temperature adjustment of the heater 261, pressure adjustment of the reservoir 267, adjustment of the drive frequency of the piezoelectric element 264, and the like.

First, the target generation processor 52A controls the heater 261 via the heater power source 53 based on the detection value of the temperature sensor 262 so that the target substance in the reservoir 267 becomes a predetermined temperature equal to or higher than the melting point. When tin (Sn) is used as the target substance, the predetermined temperature is between 232° C. to 300° C. When the heater 261 is driven, the target substance stored in the reservoir 267 melts into a liquid state.

In the initial setting, the target generation processor 52A sets the pressure in the reservoir 267 to a target pressure via the pressure regulator 263 in order to output the target substance from the nozzle hole 268. The pressure regulator 263 supplies and exhausts gas in the reservoir 267 based on a control signal from the target generation processor 52A to set the pressure in the reservoir 267 to the target pressure. The pressure in the reservoir 267 defines an output pressure of the target substance output from the nozzle hole 268, and consequently defines the velocity of the target 27 in the form of a droplet moving toward the plasma generation region 25. The target pressure is, for example, a pressure in the range from a few MPa to 40 MPa. The target velocity of the target 27 is, for example, velocity in the range of 60 m/s to 120 m/s.

Further, in the initial setting, the target generation processor 52A sets the drive frequency of the piezoelectric element 264. As described above, the drive frequency of the piezoelectric element 264 defines the generation frequency f. The drive frequency of the piezoelectric element 264 is adjusted so that the target 27 is generated at the target generation frequency f. The initial setting of the drive frequency of the piezoelectric element 264 is performed while operating the target supply unit 26A and supplying the target 27 to the plasma generation region 25. When the pressure is applied to the reservoir 267 in a state in which the target substance is melted and the piezoelectric element 264 is vibrated, the nozzle 265 is vibrated and a plurality of targets 27 are periodically supplied to the plasma generation region 25.

The EUV light generation processor 5A analyzes the target image TP input from the image measurement unit 43, and calculates the actual measurement value of the generation cycle of the targets 27 from the intervals between the plurality of targets 27 sequentially passing through the plasma generation region 25. The EUV light generation processor 5A calculates the difference between the calculated actual measurement value of the generation cycle and the target value of the generation cycle, and outputs the difference to the target generation processor 52A. The target generation processor 52A adjusts the drive frequency of the piezoelectric element 264 so that the actual measurement value of the generation cycle of the targets 27 become the target value. Thus, the generation frequency f of the target 27 is set to the target value.

When the initial setting is completed, the EUV light generation processor 5A performs the basic operation of step S230.

The basic operation in step S230 is an operation of driving the heater 261, the pressure regulator 263, and the piezoelectric element 264 at the temperature, the pressure, and the drive frequency adjusted in the initial setting. In the basic operation, the target 27 is supplied to the plasma generation region 25 at the target generation frequency f.

When the initial setting is completed in step S210 (YES in step S210), processing proceeds to step S230 without performing the initial setting in step S220.

2.3 Problem

When the EUV light generation apparatus 1A according to the comparative example is used for a long period of time, the volume of the targets 27 may change. As the reason, change in the diameter of the nozzle hole 268 of the target supply unit 26A, clogging of the filter 266, and the like are considered. One of the change in the diameter of the nozzle hole 268 is an increase in the diameter that occurs when the inner wall is gradually eroded by the target substance passing through the nozzle hole 268. Another is a decrease in the diameter that occurs when a compound film of the target substance and another metal is deposited on the inner wall of the nozzle hole 268.

Figure 6:
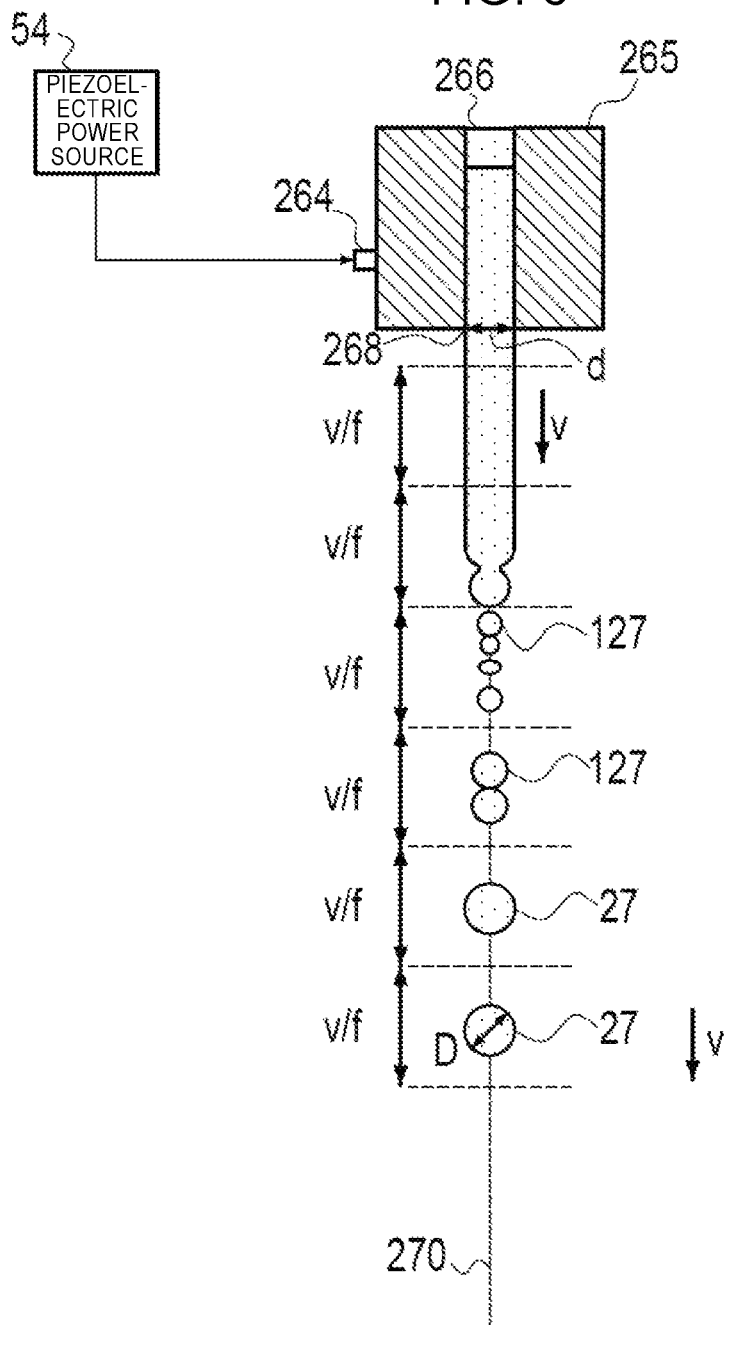
FIG. 6 is a diagram conceptually showing a target generation mechanism.

FIG. 6 conceptually shows a target generation mechanism. The pressure in the reservoir 267 causes the molten target substance to be output from the nozzle 265. The form of the target substance immediately after being output from the nozzle 265 is a columnar body whose axial direction extends in the output direction. When the nozzle 265 is vibrated due to the vibration applied from the piezoelectric element 264, the target substance of the columnar body is divided into droplets 127 having a smaller volume than the target 27. Among the plurality of droplets 127, some adjacent droplets 127 are combined with each other in the process of traveling on the target trajectory 270, and become the target 27 in a droplet form having a larger volume than the droplet 127.

In FIG. 6, assuming that the diameter of the nozzle hole 268 is d, the velocity in the direction of the target trajectory 270 is V, and the generation frequency of the target 27 is f, the diameter D of the target 27 can be calculated by following Equation (1) and Equation (2). Here, d and D are both diameters.

[Equation 1]

$$\frac{4\pi}{3}\left(\frac{D}{2}\right)^3 = \pi\left(\frac{d}{2}\right)^2\left(\frac{v}{f}\right) \quad (1)$$

[Equation 2]

$$D = \sqrt[3]{\frac{3d^2}{2}\left(\frac{v}{f}\right)} \quad (2)$$

The velocity V of the target 27 is defined by the output pressure, and the generation frequency f of the target 27 is defined by the drive frequency of the piezoelectric element 264. In the case in which the output pressure and the drive frequency are constant, that is, V/f is constant, when the diameter d of the nozzle hole 268 increases, the output amount of the target substance per unit time increases, and thus the diameter D of the target 27 increases. Similarly, in the case in which V/f is constant, when the diameter d of the nozzle hole 268 decreases, the output amount of the target substance per unit time d decreases, and thus the diameter D of the target 27 decreases. The larger the diameter D is, the larger the volume of the target 27 is. Further, even in the case in which the diameter d of the nozzle hole 268 does not change, when the filter 266 is clogged, the output velocity of the target substance decreases, and the volume of the target 27 decreases.

When the volume of the target 27 is too large, there is a case in which the amount of debris generated upon irradiation with the pulse laser light 33 is increased. Further, when the volume of the target 27 is too small, there is a case in which the output of the EUV light decreases, and a change in the volume of the target 27 may cause the output of the EUV light to be unstable.

3. EUV Light Generation Apparatus of First Embodiment

Figure 7:
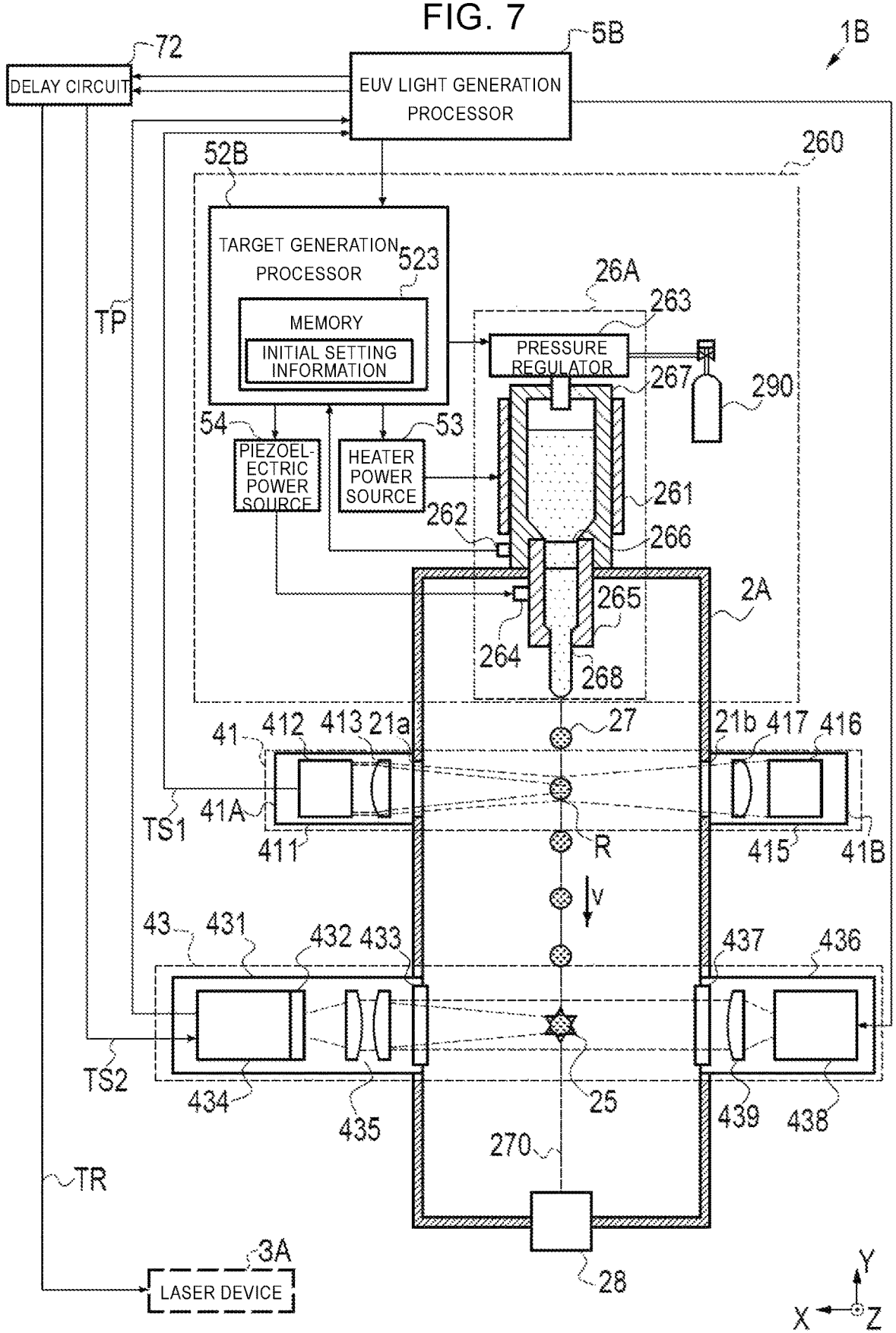
FIG. 7 is a sectional view showing the configuration of the EUV light generation apparatus according to a first embodiment.

The EUV light generation apparatus 1B of the first embodiment shown in FIG. 7 will be described. Any component same as that described above is denoted by an identical reference sign, and duplicate description thereof is omitted unless specific description is needed.

3.1 Configuration

The difference in the configuration between the EUV light generation apparatus 1B of the first embodiment and the EUV light generation apparatus 1A according to the comparative example lies only on a target generation processor 52B. Functionally, the target generation processor 52B is different from the target generation processor 52A of the comparative example in that the target generation processor 52B has a function of changing the generation frequency f of the target 27 based on the size of the target 27. In order to realize such a function, the control program and the initial setting information of the target generation processor 52B have been improved.

3.2 Operation

The operation of the EUV light generation apparatus 1B of the first embodiment will be described. In the EUV light generation apparatus 1B as well, the main flowchart relating to the EUV light generation is similar to the main flowchart of the EUV light generation apparatus 1A according to the comparative example shown in FIG. 4. The difference is that the content of the target generation in step S20 is changed from the flowchart shown in FIG. 5 to the flowchart shown in FIG. 8 as an example.

Figure 8:
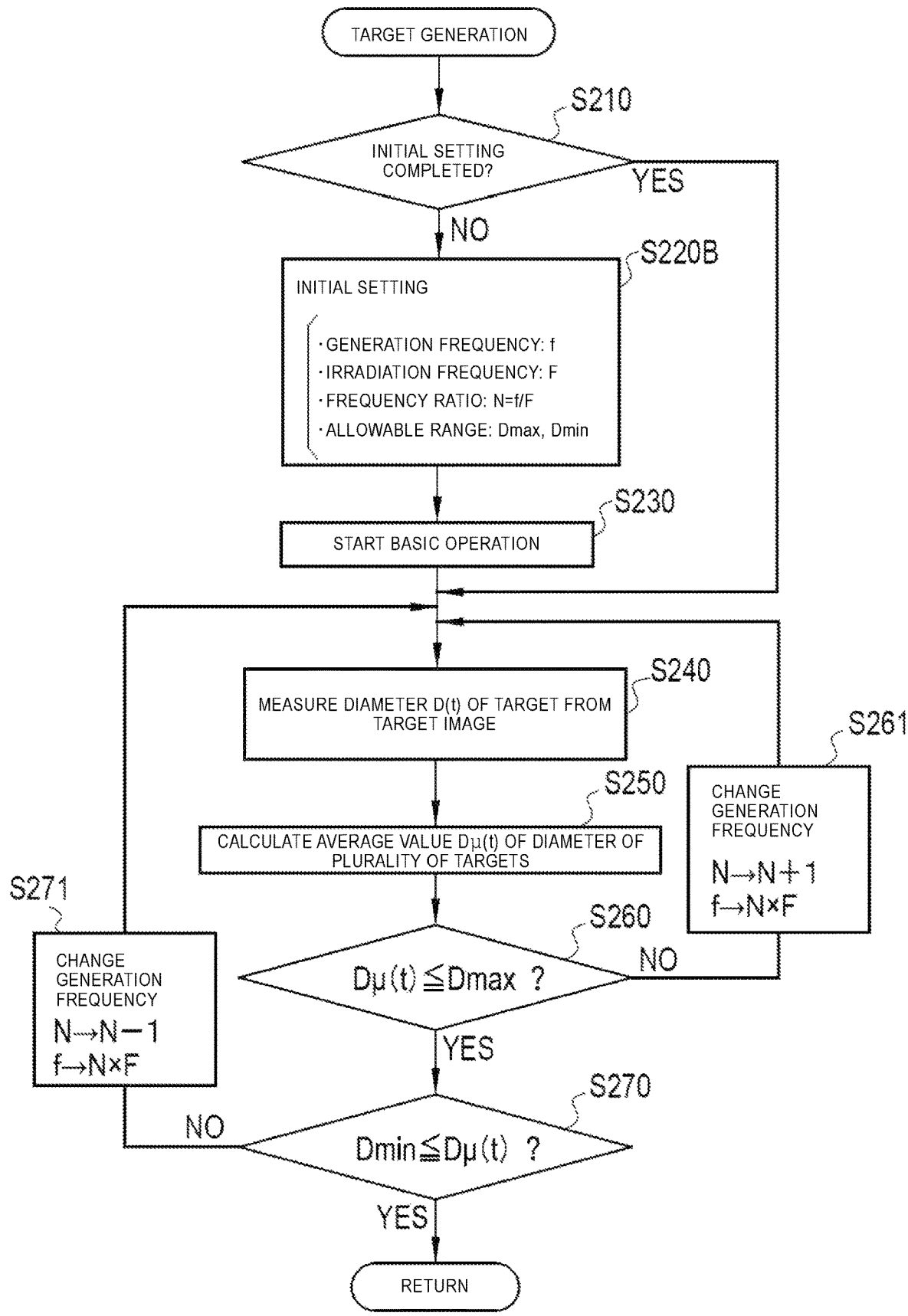
FIG. 8 is an example of a flowchart showing the target generation process performed by a target generation processor based on the size of the target.

The flowchart of the first embodiment shown in FIG. 8 is different from the flowchart of the comparative example shown in FIG. 5 in the following two points. The first difference is that the initial setting of step S220 is changed to the initial setting of step S220B. The second difference is that after the basic operation of step S230 is started, the step of the change control of the generation frequency f of the target 27 is added.

In step S220B, the initial setting for adjusting the temperature of the heater 261, the pressure of the reservoir 267, and the drive frequency of the piezoelectric element 264 to target values is similarly performed in the target generation processor 52B as well. The difference is that an allowable range of the diameter D of the target 27 is set as information used for the change control of the generation frequency f. An upper limit value Dmax and a lower limit value Dmin of the allowable range are stored in the memory 523 as information of the allowable range of the diameter D. In the initial setting of step S220B, the target generation processor 52B reads the allowable range of the diameter D. Further, in step S220B, the target generation processor 52B calculates irradiation frequency F and frequency ratio N (=f/F) between the irradiation frequency F and the generation frequency f. When the initial setting of step S220B is completed, the target generation processor 52B proceeds to step S230.

The basic operation in step S230 is similar to the basic operation according to the comparative example shown in FIG. 5. The drive frequency of the piezoelectric element 264 is adjusted so that the generation frequency f of the target 27 becomes an initial target value immediately after the initial setting is completed. After starting the basic operation in step S230, the target generation processor 52B starts the change control of the generation frequency f after step S240.

In step S240, the target generation processor 52B first obtains the target image TP measured by the image measurement unit 43 from the EUV light generation processor 5A. Then, a diameter D(t) of the target 27 is measured from the target image TP. The diameter D(t) is measured for each of the targets 27.

In step S250, the target generation processor 52B calculates an average value Dμ(t) of the diameters D(t) of the targets 27.

In step S260 and step S270, the target generation processor 52B determines whether or not the diameter D of the target 27 falls within an allowable range.

First, in step S260, the target generation processor 52B compares the average value Dμ(t) with the upper limit value Dmax of the allowable range. When the average value Dμ(t) is equal to or less than the upper limit value Dmax (YES in step S260), processing proceeds to step S270, and when the average value Dμ(t) exceeds the upper limit value D max (NO in step S260), processing proceeds to step S261.

In step S270, the target generation processor 52B compares the average value Dμ(t) with the lower limit value Dmin of the allowable range. When the average value Dμ(t) is equal to or higher than the lower limit value Dmin (YES in step S270), since the average value Dμ(t) is within the allowable range, the target generation processor 52B returns to step S30 shown in FIG. 4 without changing the generation frequency f. On the other hand, when the average value Dμ(t) is less than the lower limit value Dmin (NO in step S270), processing proceeds to step S271.

In step S261, since the average value Dμ(t) exceeds the upper limit value Dmax of the allowable range, the generation frequency f is increased so that the average value Dμ(t) falls within the allowable range. On the other hand, in step S271, since the average value Dμ(t) is less than the lower limit value Dmin of the allowable range, the target generation processor 52B decreases the generation frequency f so that the average value Dμ(t) falls within the allowable range.

The target generation processor 52B changes the generation frequency f by adjusting the drive frequency of the piezoelectric element 264 in steps S261 and S271. In the initial setting of step S220B, the drive frequency of the piezoelectric element 264 is adjusted to the initial target value so that the generation frequency f becomes the target value. Changing the generation frequency f in step S261 and step S271 means to change the target value of the generation frequency f by changing the target value of the drive frequency of the piezoelectric element 264. In the target generation, the basic operation is continued even after the target value of the generation frequency f is changed.

The generation frequency f is changed to a natural number multiple of the irradiation frequency F of the pulse laser light 33. That is, in step S261, when increasing the generation frequency f, 1 is added to the frequency ratio N before the change, and a value obtained by multiplying the added value by the irradiation frequency F is set as the generation frequency f after the change. For example, when the target value of the generation frequency f before the change is 120 kHz and the irradiation frequency F is 20 kHz, the frequency ratio N before the change is 6. When the generation frequency f is increased, N+1=6+1=7 and f=N×F=20 kHz× 7=140 kHz are obtained, and the generation frequency f is changed from 120 kHz to 140 kHz.

On the other hand, in step S271, when decreasing the generation frequency f, 1 is subtracted from the initial frequency ratio N, and a value obtained by multiplying the subtracted value by the irradiation frequency F is set as the generation frequency f after the change. For example, it is assumed that the target value of the generation frequency f before the change is 120 kHz, the irradiation frequency F is 20 kHz, and the frequency ratio N before the change is 6. When the generation frequency f is decreased, N−1=6−1=5 and f=N×F=20 kHz×5=100 kHz are obtained, and the generation frequency f is changed from 120 kHz to 100 kHz. The target generation processor 52B repeats this process until the diameter d of the target 27 falls within the allowable range.

The change control of the generation frequency f shown in FIG. 8 will be conceptually described with reference to FIG. 9. FIG. 9 is a schematic diagram of a case in which the generation frequency f is increased when the diameter D of the target 27 is increased due to an increase in the diameter d of the nozzle hole 268.

In FIG. 9, it is assumed that an initial state is at time t1, while the diameter of the nozzle hole 268 in the initial state is d(t1) and the diameter of the target 27 is D(t1). Here, f1 is the initial target value of the generation frequency f. It is assumed that, when time elapses from time t1 to time t2, the diameter d of the nozzle hole 268 becomes larger from d(t1) and changes to d(t2). In this case, the diameter D of the target 27 changes to D(t2) larger than D(t1). Also at time t2, since f1 does not change, the irradiation frequency F and the generation frequency f of the pulse laser light 33 are synchronized in the same manner as in the initial state. Therefore, although the target 27 is irradiated with the pulse laser light 33, since the volume of the target 27 is increased, the amount of generated debris is larger than that at time t1.

When the diameter D(t2) of the target 27 at time t2 exceeds the upper limit value Dmax, the target generation processor 52B increases the generation frequency f by increasing the drive frequency of the piezoelectric element 264 as shown in step S261 of FIG. 8. Here, f2, which is the generation frequency f after the change, is larger than f1 before the change and is a value of a natural number multiple of the irradiation frequency F. Time t3 is the time after changing the generation frequency f to f2. As the generation frequency f increases, the diameter D(t3) of the target 27 decreases. Since f2 is a natural number multiple of the irradiation frequency F, the target 27 is irradiated with the pulse laser light even after the generation frequency f is changed. Since the diameter D(t3) of the target 27 at time t3 is smaller than the diameter D(t2) at time t2, the amount of generated debris at time t3 is reduced compared to at time t2.

In FIG. 9, as the generation frequency f, both f1 in the initial state at time t1, t2 and f2 at time t3 after the change are natural number multiples of the irradiation frequency F. The relationship between each of f1 and f2 and the irradiation frequency F is expressed by Equation (3). Both $n_1$ and $n_2$ are natural numbers. With respect to the diameter D of the target 27, the relationship between the diameter D(t3) at time t3 and the diameter D2(t2) at time t2 is represented by Equation (4).

[Equation 3]
$$f1 = n_1 F, f2 = n_2 F \quad (3)$$

[Equation 4]
$$D(t_3) = \sqrt[3]{\frac{f1}{f2}} D(t_2) = \sqrt[3]{\frac{n_1}{n_2}} D(t_2) \quad (4)$$

Since FIG. 9 shows an example in which the generation frequency f is to be increased, $n_2$ is larger than $n_1$. Further, at time t3, the number of the targets 27 not to be irradiated with the pulse laser light 33 increases owing to that the generation frequency f is higher than that at time t1, t2. In FIG. 9, the targets 27 to be irradiated with the pulse laser light 33 are each denoted by a reference sign 27A, and the targets 27 not to be irradiated with the pulse laser light 33 are each denoted by a reference sign 27B. In FIG. 9, as an example, when the generation frequency f is f1, the number of the targets 27B existing between two targets 27A is one, but after the change to f2, the number of the targets 27B increases to two. Thus, when the generation frequency f increases, the number of the targets 27B not to be irradiated with the pulse laser light 33 increases.

The example of FIG. 9 corresponds to step S261 of FIG. 8, and is an example of increasing the generation frequency f. In contrast to step S261, as shown in step S271, when the size of the target 27 decreases due to a decrease in the diameter d of the nozzle hole 268, the generation frequency f is decreased in order to increase the size of the target 27. In this case, in Equation (3) and Equation (4) described above, $n_2$ is smaller than $n_1$, and f2 is smaller than f1.

Figure 10:
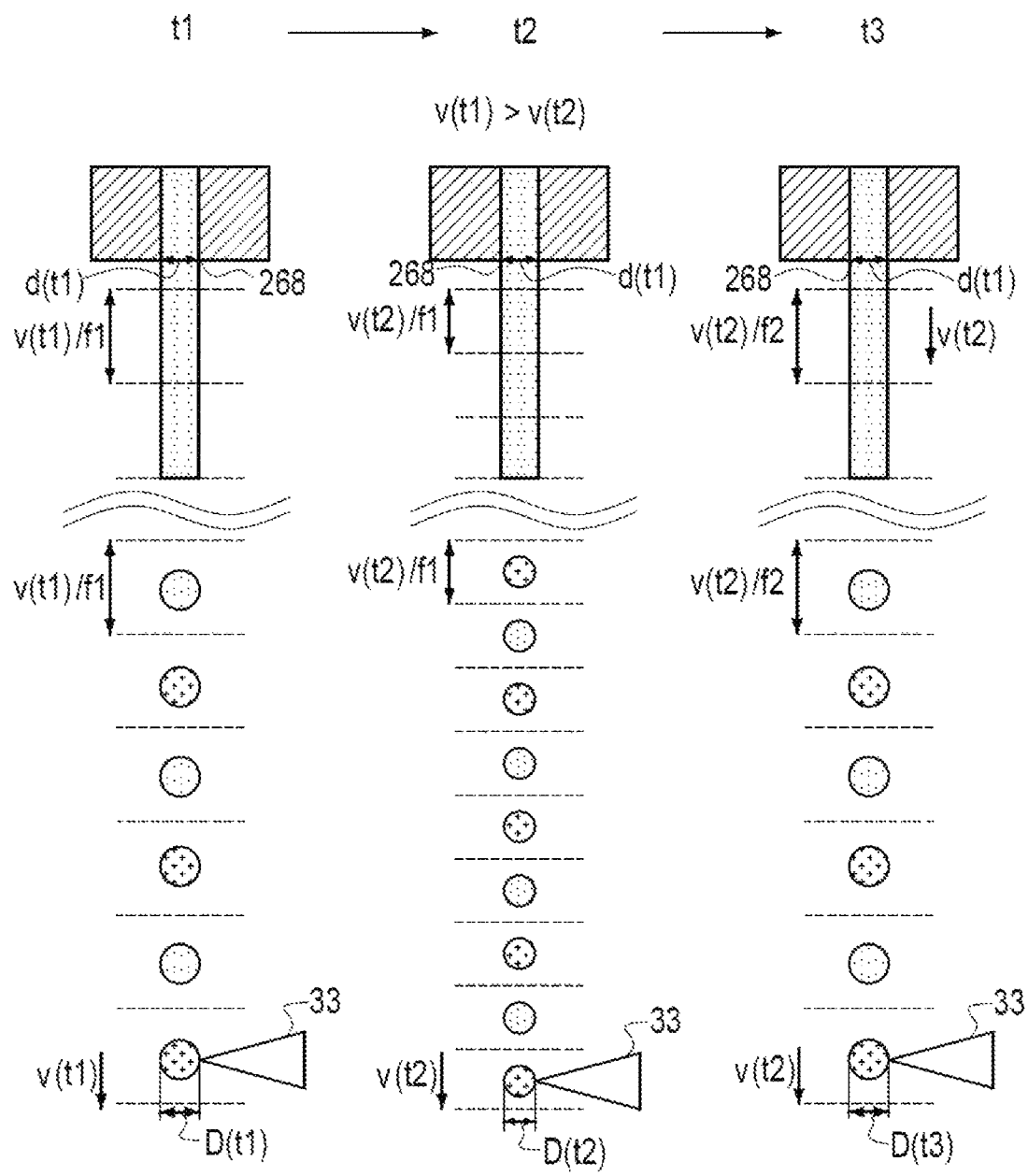
FIG. 10 is a schematic diagram of a case in which the generation frequency is decreased when the diameter of the target is decreased due to a decrease in the diameter of the nozzle hole.

In contrast to the example of FIG. 9, FIG. 10 is a schematic diagram of a case in which the generation frequency f is decreased when the diameter D of the target 27 is decreased. Further, unlike the example of FIG. 9, the example of FIG. 10 is an example of a case in which the cause of the diameter D of the target 27 becoming decreased is not an increase in the diameter d of the nozzle hole 268 but clogging of the filter 266.

In FIG. 10, at time t2 when time elapses from time t1 in the initial state, deposition of impurities progresses, and a part of the filter 266 is blocked. The diameter d of the nozzle hole 268 remains d(t1) without being changed between time t1 and time t2. When the filter 266 is partially blocked, the output velocity of the target substance output from the nozzle hole 268 decreases. Accordingly, since the output amount of the target substance per unit time decreases, the diameter D of the target 27 decreases, and V/f, which is the distance that the target 27 travels per unit time, also decreases. In the example of FIG. 10, the velocity V of the target 27 decreases from V(t) at time t1 to velocity V(t2) at time t2. However, since the generation frequency f1 does not change from f1 at time t1 and time t2, the irradiation frequency F of the pulse laser light and the generation frequency f are synchronized. However, when the volume decreases by the decrease of the diameter D of the target 27, the output of the EUV light is reduced.

When the diameter D(t2) of the target 27 at time t2 becomes less than the lower limit value Dmin, the target generation processor 52B decreases the generation frequency f by decreasing the drive frequency of the piezoelectric element 264 as shown in step S271 of FIG. 8. Here, f2, which is the generation frequency f after the change, is smaller than f1 before the change and is a value of a natural number multiple of the irradiation frequency F. Time t3 is the time after changing the generation frequency f to f2. In this case, as the generation frequency f decreases, the diameter D(t3) of the target 27 increases. Since f2 is a natural number multiple of the irradiation frequency F, even after the generation frequency f is changed, the target 27 is irradiated with the pulse laser light 33. In the example of FIG. 10, since the diameter D(t3) of the target 27 at time t3 is larger than the diameter D(t2) at time t2, the output of EUV light at time t3 is increased compared to at time t2. In contrast to the example of FIG. 9, in the example of FIG. 10, $n_2$ is smaller than $n_1$, and f2 is smaller than f1 in Equation (3) and Equation (4) described above.

3.3 Effects

As described above, the EUV light generation apparatus 1B of the present embodiment is the EUV light generation apparatus to generate EUV light by irradiating the target 27 with the pulse laser light 33 to turn the target 27 into plasma including the chamber 2A, the target supply unit 26A configured to supply the target 27 to the plasma generation region 25 in the chamber 2A, the laser device 3A configured to generate the pulse laser light 33 to be radiated to the target 27, and the target generation processor 52B configured to change the generation frequency f of the target 27 generated by the target supply unit 26A to a natural number multiple of the irradiation frequency F of the pulse laser light 33 based on the size of the target 27. Here, the diameter D of the target 27 is an example of the size of the target of the present disclosure, and the target generation processor 52B is an example of the processor of the present disclosure.

According to the EUV light generation apparatus 1B of the present embodiment as described above, even when the volume of the target 27 varies due to the change of the diameter d of the nozzle hole 268, clogging of the filter 266, or the like, the following effects can be obtained by changing the generation frequency f. That is, there are an effect of suppressing an increase in the amount of generated debris and an effect of suppressing decrease in the output of EUV light.

The first embodiment further includes the image measurement unit 43 for imaging the image of the target 27 and outputting the target image TP, and the target generation processor 52B measures the size of the target 27 from the target image TP. Since the size of the target 27 is directly measured from the target image TP, the accuracy of determining whether or not the size of the target 27 is within the allowable range may be improved as compared with a case in which the target image TP is not used.

In the first embodiment, an allowable range of the size of the target 27 is set in advance, and the target generation processor 52B increases the generation frequency f when the size of the target 27 exceeds the upper limit value Dmax of the allowable range, and decreases the generation frequency f when the size of the target 27 falls below the lower limit value Dmin of the allowable range. By setting the allowable range, since the generation frequency f is not changed within the allowable range, it is possible to suppress the load of the control compared to, for example, control in which the generation frequency f is adjusted to one threshold value instead of the allowable range.

In the first embodiment, the target generation processor 52B compares the average value Dμ of the diameters D, which is an example of the measured size of the plurality of targets 27, with the upper limit value Dmax and the lower limit value Dmin. Thus, even when there is a variation in the measurement value, relatively stable control can be performed. Here, the average value Dµ is an example of the representative value of the present disclosure. As the representative value, a median value of a plurality of measurement values may be used other than the average value Dµ.

Further, although the diameter D of the target 27 is used as the size of the target 27, the volume of the target 27 may be used. In this case, for example, a plurality of image measurement units 43 having different imaging directions are provided. Then, the diameter D is measured from each of the target images TP imaged by the image measurement units 43, and the volume of the target 27 is obtained by calculation from the plurality of measured diameters D. Further, a pressure sensor that measures the pressure at the time of collision of the target 27 may be provided in the target collection unit 28, and the volume of the target 27 may be obtained by calculation from the pressure value measured by the pressure sensor. As a method of calculating the volume from the pressure value, for example, the mass of the target 27 is calculated from the pressure value, and the volume is obtained from the mass and the density of the target substance.

4. EUV Light Generation Apparatus of Second Embodiment

Next, the EUV light generation apparatus of a second embodiment will be described. Any component same as that described above is denoted by an identical reference sign, and duplicate description thereof is omitted unless specific description is needed.

4.1 Configuration

Since the basic configuration of the EUV light generation apparatus according to the second embodiment is substantially the same as that of the EUV light generation apparatus 1B according to the first embodiment, description of the entire configuration is omitted. The difference in the configuration between the EUV light generation apparatus according to the second embodiment and the EUV light generation apparatus according to the first embodiment lies only on a target generation processor 52C shown in FIG. 11. The target generation processor 52C is the same as that of the EUV light generation apparatus 1B according to the first embodiment in that the generation frequency f of the target 27 is changed based on the size of the target 27, but the actualization method is different. In response to the modification of the actualization method, the target generation processor 52C has been improved in the control program and in the initial setting information.

That is, the target generation processor 52C of the second embodiment changes the generation frequency f of the target 27 based not on the size of the target 27 but on the related information related to the size of the target 27. More specifically, in the second embodiment, the related information is an elapsed time t from a preset time point, and the target generation processor 52C changes the generation frequency f based on the elapsed time t. As shown in the first embodiment, the diameter d of the nozzle hole 268 varies with the elapse of time, and clogging of the filter 266 proceeds with the passage of time as well. Therefore, the elapsed time t can be understood to be related information related to the size of the target 27.

Figure 11:
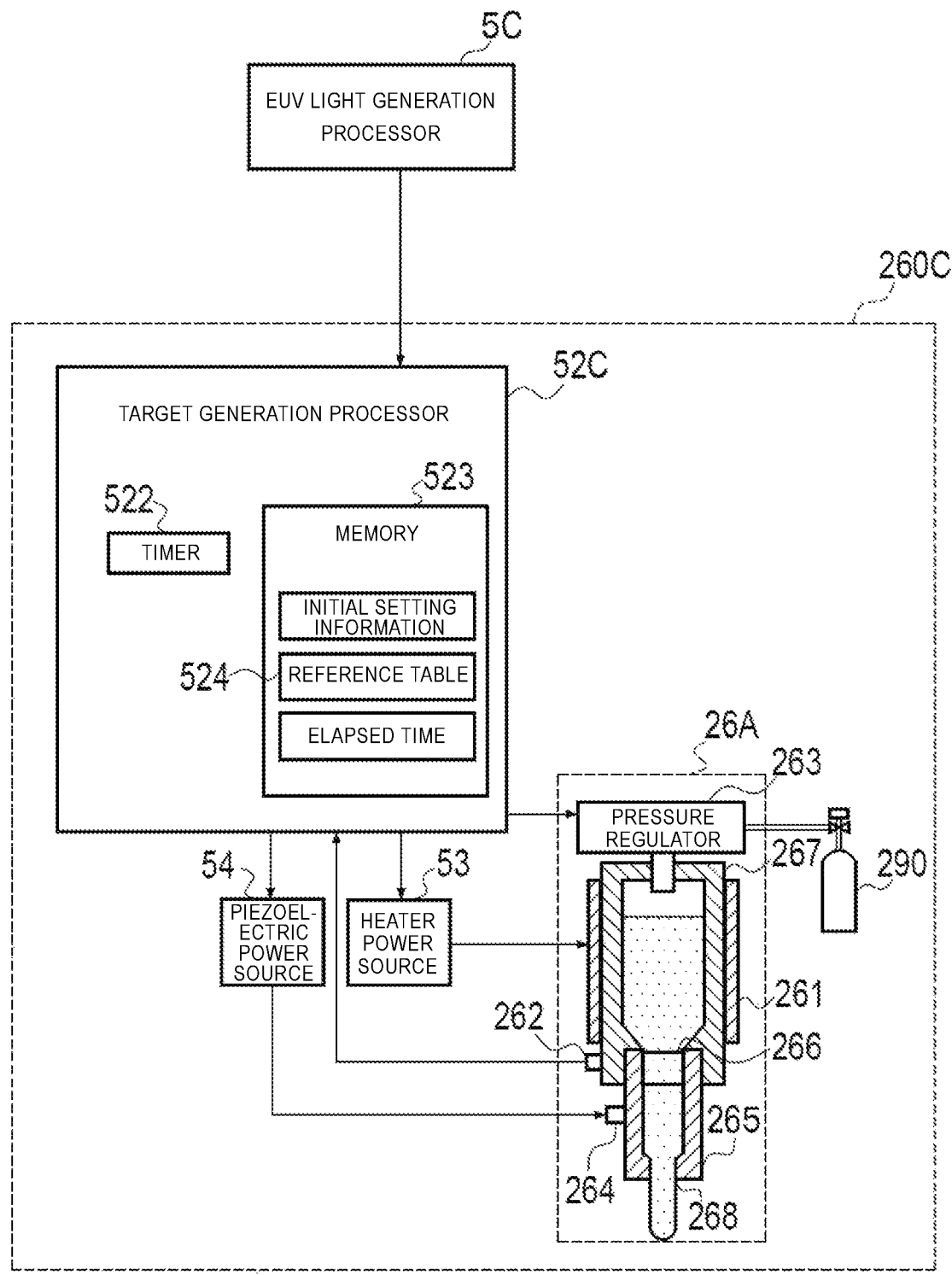
FIG. 11 is a diagram showing an example of the configuration of the target generation processor that performs target generation process based on related information related to the size of the target.

As shown in FIG. 11, the target generation processor 52C includes a timer 522. The timer 522 is an example of an elapsed time measurement unit for measuring the elapsed time t from the preset time point. In the present example, the cumulative value of the operation time of the target supply unit 26A is used as the elapsed time t. The target generation processor 52C causes the timer 522 to measure the operation time of the target supply unit 26A, and updates the elapsed time t in the memory 523 based on the measurement value.

Figures 12, 13:
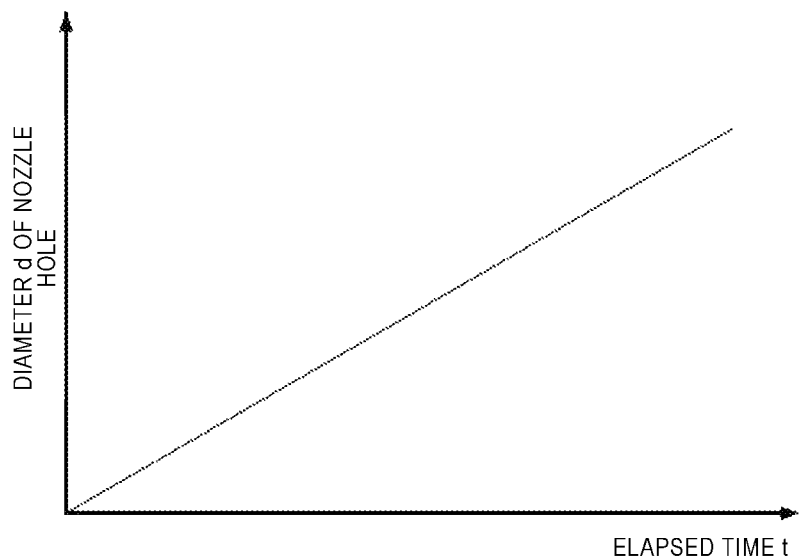
FIG. 12 is an example of a reference table used in the target generation process.
FIG. 13 is a diagram showing the relationship between elapsed time and the diameter of the nozzle hole.

In addition to the initial setting information and the elapsed time t, a reference table 524 is stored in the memory 523. As shown in FIG. 12, the reference table 524 records a correspondence relationship between a plurality of reference times RX compared with the elapsed time t and a plurality of generation frequencies f set corresponding to the plurality of reference times RX. In the present example, the memory 523 which is a storage device in the target generation processor 52C stores the correspondence relationship, but a storage device outside the target generation processor 52C may store the correspondence relationship.

For example, as shown in FIG. 13, the reference table 524 is created on the assumption that the diameter d of the nozzle hole 268 increases as the elapsed time t increases. On the assumption of the relationship shown in FIG. 13, since the diameter D of the target 27 increases as the elapsed time t increases, it is necessary to increase the generation frequency fin order to decrease the diameter D. Therefore, in the reference table 524, the generation frequency f increases as the reference time RX increases. The reference time RX and the generation frequency f have one-to-one correspondence. The reference number RN is a number assigned to each combination of the reference time RX and the generation frequency f.

The reference table 524 is created by, for example, actually measuring a change in the size of the target 27 according to the elapsed time t and assigning an appropriate generation frequency f according to the elapsed time t based on the actual measurement value.

4.2 Operation

Next, with reference to the flowchart shown in FIG. 14, the operation of the EUV light generation apparatus of the second embodiment will be described.

In the EUV light generation apparatus according to the second embodiment as well, the main flowchart relating to the EUV light generation is similar to the main flowchart of the EUV light generation apparatus 1A according to the comparative example shown in FIG. 4. The difference is that the content of the target generation in step S20 is changed from the flowchart shown in FIG. 5 to the flowchart shown in FIG. 14 as an example.

Figure 14:
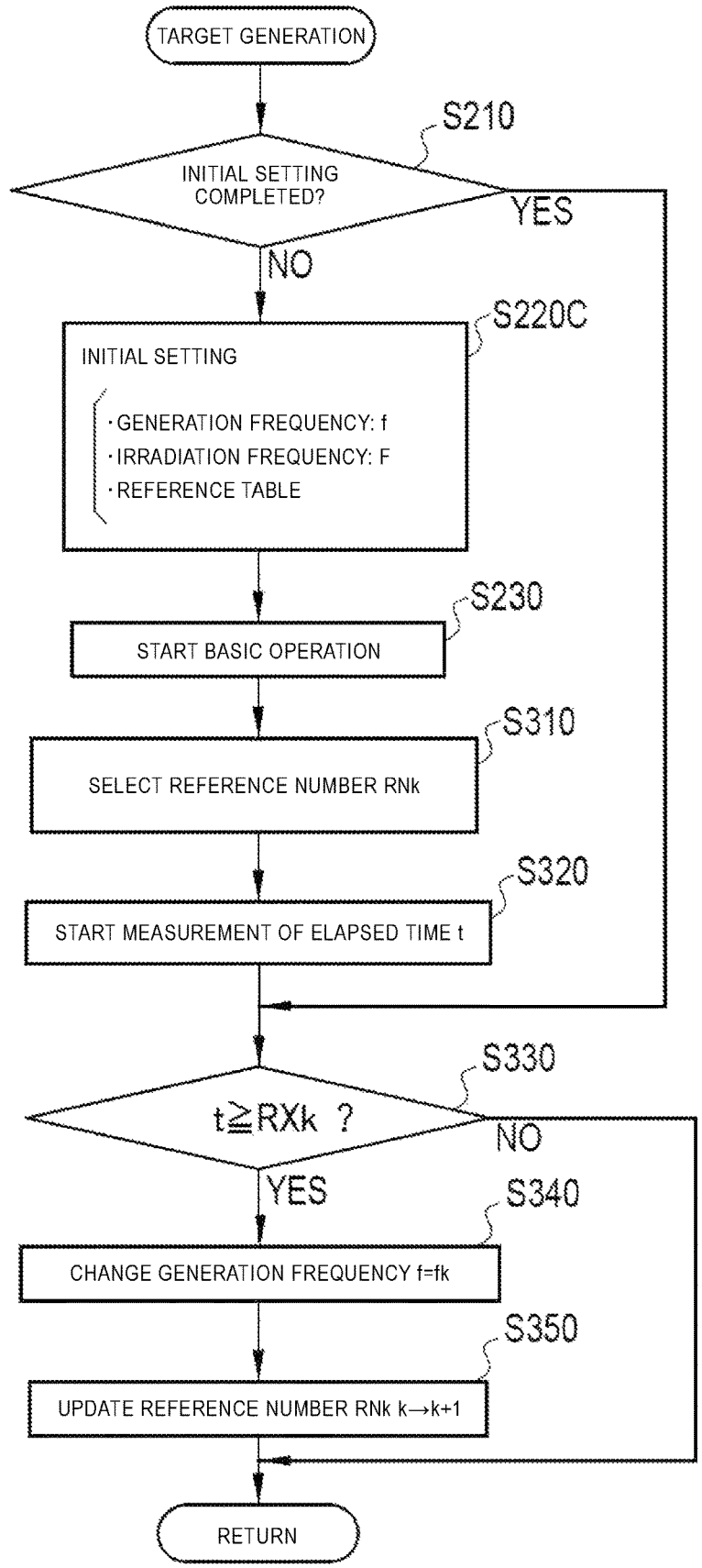
FIG. 14 is a flowchart showing the target generation process performed by the target generation processor based on the elapsed time.

The flowchart of the second embodiment shown in FIG. 14 is different from the flowchart of the first embodiment shown in FIG. 8 in the following two points. The first difference is that the initial setting of step S220B is changed to the initial setting of step S220C. The second difference is that the change control of the generation frequency f of the target 27 in step S330 and thereafter is different.

In the initial setting in step S220C, the initial setting for adjusting the temperature of the heater 261, the pressure of the reservoir 267, and the drive frequency of the piezoelectric element 264 to target values is performed in the target generation processor 52C as well similarly to the first embodiment. The difference is that the target generation processor 52C reads the reference table 524 instead of the allowable range. When the initial setting of step S220C is completed, the target generation processor 52C proceeds to step S230.

The basic operation in step S230 is similar to that in the first embodiment. After starting the basic operation in step S230, the target generation processor 52C proceeds to step S310.

In step S310, the target generation processor 52C selects the reference number RNk of the reference table 524. The elapsed time t is the cumulative value of the operation time.

Therefore, when the EUV light generation apparatus is stopped, the target generation processor 52C stores the value k of the reference number RNk at the time of stopping in the memory 523. When the EUV light generation apparatus is restarted, the target generation processor 52C proceeds to NO in step S210, and proceeds to step S310 via steps S220C and S230. In step S310, the target generation processor 52C reads the value of k stored in the memory 523 at the time of the previous stop, and selects the reference number RNk corresponding to the value of k. Then, the combination of the reference time RTk and the generation frequency fk corresponding to the reference number RNk is read.

In step S320, the target generation processor 52C activates the timer 522 and starts measuring the elapsed time t. After step S320, the target generation processor 52C starts the change control of the generation frequency f in step S330 and thereafter.

In step S330, the target generation processor 52C compares the elapsed time t with the reference time RXk corresponding to the selected reference number RNk. When the elapsed time t does not reach the reference time RXk, processing returns to step S30 shown in FIG. 4 without changing the generation frequency f. When the elapsed time t reaches the reference time RXk (YES in S330), the target generation processor 52C proceeds to step S340.

In step S340, the target generation processor 52C changes the generation frequency f to the generation frequency fk corresponding to the reference time RXk. When the generation frequency f is changed, processing proceeds to step S350.

In step S350, the target generation processor 52C updates the reference number RNk by adding 1 to the value of k. After step S350, step S30 of FIG. 4. The target generation processor 52C repeats the above process until the EUV light generation apparatus is stopped.

4.3 Effects

As described above, in the first embodiment, the generation frequency f is changed based on the size of the target 27 based on the image data. However, in the second embodiment, the generation frequency f is changed based on the elapsed time t from the preset time point without measuring the size of the target 27. Also in the second embodiment, the effect of suppressing an increase in the amount of generated debris and the effect of stabilizing the output of EUV light are the same as those in the first embodiment.

Further, in the second embodiment, the cumulative value of the operation time of the target supply unit 26A is used as the elapsed time t. As described above, the change in the diameter D of the target 27 is considered to be caused due to the change in the diameter d of the nozzle hole 268 and clogging of the filter 266. These are both considered to be highly correlated with the operation time of the target supply unit 26A. Therefore, it is considered that by using the cumulative value of the operation time of the target supply unit 26A as the elapsed time t, it is possible to appropriately perform change control of the generation frequency f as compared with a case in which the cumulative value of the operation time is not used.

The elapsed time t may include a stop period during which the target supply unit 26A is stopped. Even when the target supply unit 26A is stopped, there is a case in which variation of the diameter d of the nozzle hole 268, clogging of the filter, or the like progresses. Including the stop period in the elapsed time t is effective in such a case.

In the second embodiment, the target generation processor 52C increases the generation frequency f as the elapsed time t increases. Therefore, as compared with the case of increasing and decreasing the generation frequency f, the change control of the generation frequency f may be simplified. Naturally, in a case in which clogging of the filter 266 is dominant as the cause of the change in the size of the target 27, the generation frequency f may be decreased as the elapsed time t increases.

Further, the second embodiment adopts the reference table 524 in which a correspondence relationship between a plurality of reference times RX compared with the elapsed time t and a plurality of generation frequencies f set corresponding to the plurality of reference times RX is recorded. In the second embodiment, the target generation processor 52C includes a memory 523 in which the reference table 524 is stored in advance, and changes the generation frequency f according to the elapsed time t with reference to the reference table 524. Thus, by using the correspondence relationship such as the reference table 524, more flexible correspondence may be easily performed compared to a case in which the relationship between the elapsed time t and the generation frequency f is defined by a mathematical expression. For example, when the diameter D of the target 27 varies due to complex factors such as a temporal change in the diameter d of the nozzle hole 268 and a temporal change in clogging of the filter 266, the relationship between the elapsed time t and the generation frequency f may become complicated. In such a case, a method of using the reference table 524 or the like in which the correspondence relationship is recorded is effective. In addition, the reference table 524 may be easier to perform maintenance such as correction and update than the mathematical expression.

5. EUV Light Generation Apparatus of Third Embodiment

Next, the EUV light generation apparatus of a third embodiment will be described. Any component same as that described above is denoted by an identical reference sign, and duplicate description thereof is omitted unless specific description is needed.

5.1 Configuration

Figure 15:
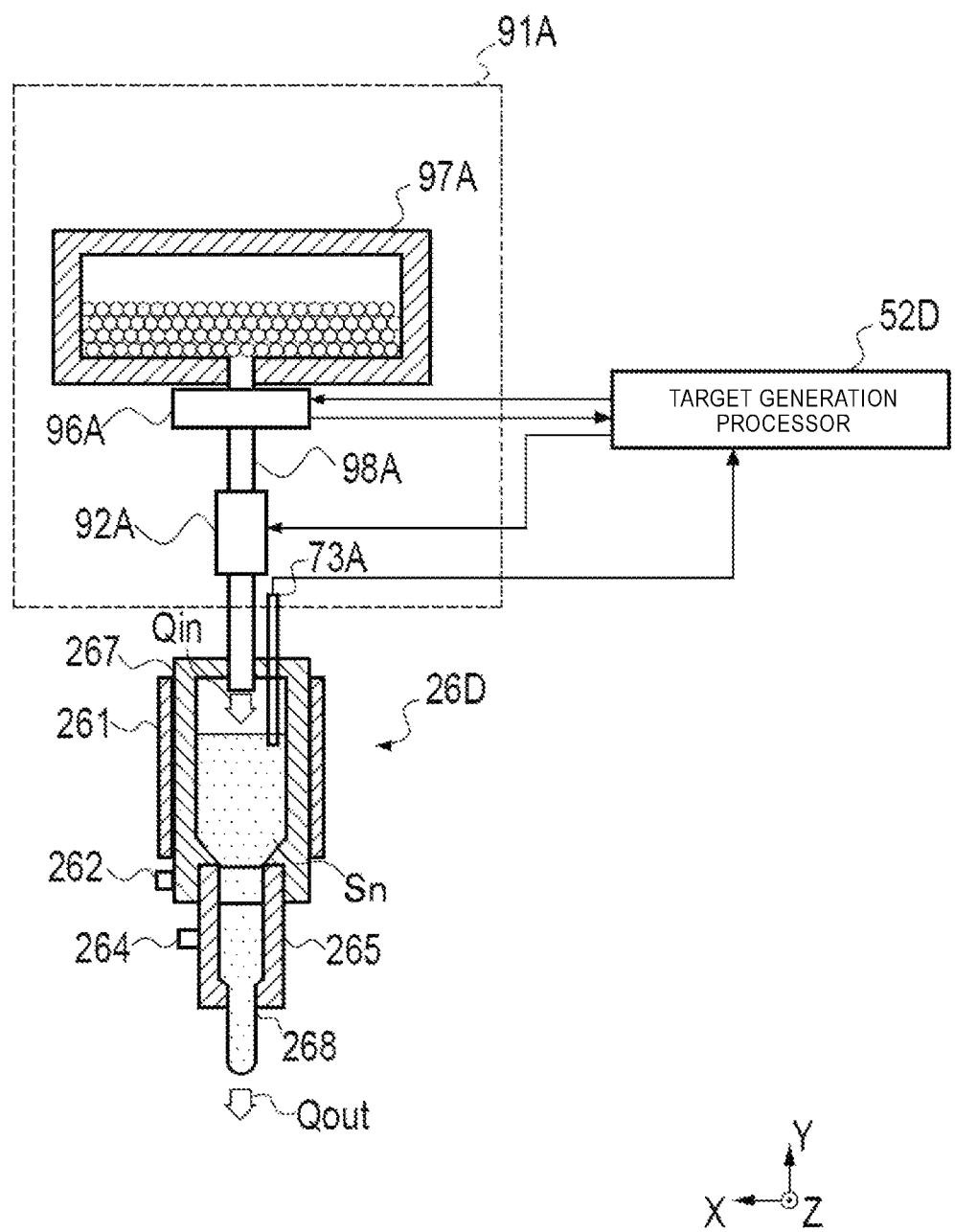
FIG. 15 is a diagram showing the configuration of a target supply unit including a refill mechanism.

The configuration of the EUV light generation apparatus according to the third embodiment is different from the EUV light generation apparatus 1B according to the first embodiment in that a refill mechanism 91A is provided as shown in FIG. 15. In addition, the third embodiment is similar to the first embodiment in that the generation frequency f is changed based on the diameter D of the target 27, but is different in a method of measuring the diameter D of the target 27. In the first embodiment, the diameter D of the target 27 is measured from the target image TP. On the other hand, in the third embodiment, the diameter D of the target 27 is calculated from the replenishment amount of the refill mechanism 91A. In other words, in the first embodiment, the target 27 is directly measured, whereas in the third embodiment, the diameter D of the target 27 is indirectly measured based on the replenishment amount. Hereinafter, the difference will be mainly described.

As shown in FIG. 15, the refill mechanism 91A is a mechanism for replenishing the target substance to the reservoir 267 of a target supply unit 26D. The refill mechanism 91A includes a tank 97A, a measuring unit 96A, a pipe 98A, a load lock chamber 92A, and a liquid level sensor 73A. The tank 97A contains solid tin, which is a solid target substance, as a material of the target 27. The solid tin is, for example, spherical. The measuring unit 96A measures the mass of the solid tin supplied from the tank 97A to the pipe 98A. The measuring unit 96A counts, for example, the number of pieces of the solid tin to be replenished. Since the mass of solid tin per piece is known, the mass of the solid tin to be supplied can be calculated based on the mass and the number of pieces thereof to be supplied.

The load lock chamber 92A is arranged on the downstream side of the measuring unit 96A in the supply direction of the solid tin. The load lock chamber 92A is connected to the reservoir 267 through an openable/closable supply port, and temporarily holds the solid tin transferred from the measuring unit 96A. The load lock chamber 92A opens the supply port in a state in which the inside of the chamber and the tank 97A have the same pressure and replenishes the solid tin into the reservoir 267.

The liquid level sensor 73A detects the liquid level of the liquid target substance in the reservoir 267. The liquid level sensor 73A of the present example has a rod shape, and has a detection region for detecting the liquid level at one location in the longitudinal direction. The liquid level sensor 73A detects whether or not the position of the liquid level of the target substance reaches the detection region. For example, the liquid level sensor 73A outputs a detection signal to a target generation processor 52D when the position of the liquid level reaches the detection region, and does not output the detection signal when the position of the liquid level does not reach the detection region. The liquid level sensor 73A is arranged such that the detection region is located at the height of the liquid level where the target substance is filled to the target level in the reservoir 267. Therefore, although the detection signal is output to the target generation processor 52D from the liquid level sensor 73A in a state in which the liquid level position of the target substance in the reservoir 267 exceeds the height of the target liquid level, the detection signal is not output to the target generation processor 52D from the liquid level sensor 73A when the liquid level position of the target substance becomes lower than the height of the target liquid level. The target generation processor 52D determines that replenishment of the target substance is unnecessary in the state in which the detection signal is received, and determines that replenishment of the target substance is necessary in the state in which the detection signal is not received.

When the target substance is output from the nozzle 265, the liquid level in the reservoir 267 is lowered. Then, when the target generation processor 52D turns into the state in which the detection signal from the liquid level sensor 73A is not received, the target generation processor 52D operates the refill mechanism 91A to replenish the solid tin into the reservoir 267 until the detection signal is received again. That is, the target generation processor 52D causes the refill mechanism 91A to replenish the solid tin so that the liquid level of the target substance in the reservoir 267 is maintained at the target liquid level position or higher.

Here, the output amount of the target substance from the reservoir 267 is defined as Qout, and the supply amount from the refill mechanism 91A to the reservoir 267 is defined as Qin. The replenishment amount Qin is the mass of the solid tin supplied to the reservoir 267 during replenishment. Assuming that Qin and Qout are substantially equal to each other, the relationship represented by following Equation (5) and Equation (6) is satisfied between the replenishment amount Qin of the refill mechanism 91A and the diameter D of the target 27. Therefore, if Qin is known, the target generation processor 52D can calculate the diameter D of the target 27 based on Equation (5) and Equation (6).

[Equation 5]
$$\frac{4\pi}{3}\left(\frac{D}{2}\right)^3 = \frac{1}{f}Q_{out} = \frac{1}{f}Q_{in} \quad (5)$$

[Equation 6]
$$D = \sqrt[3]{\frac{6}{\pi f}Q_{in}} \quad (6)$$

Figure 16:
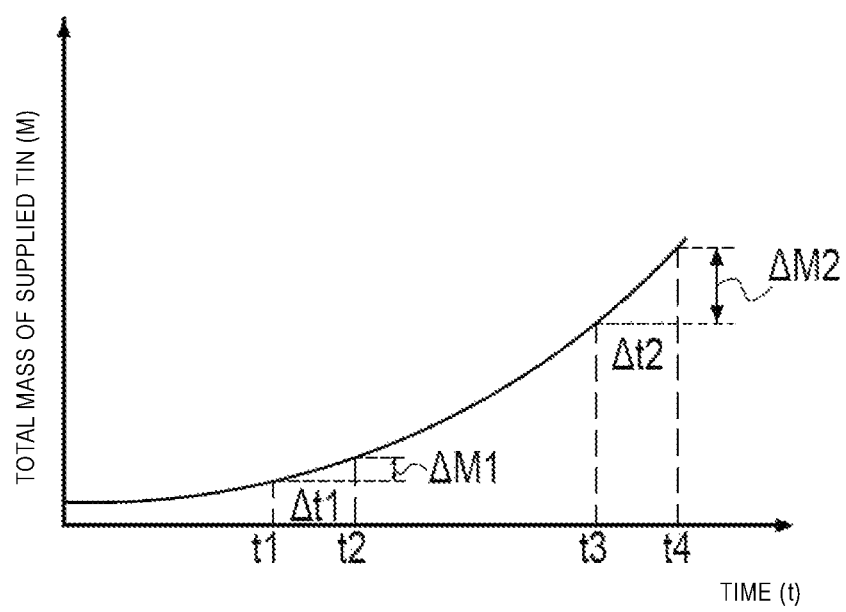
FIG. 16 is a graph showing an example of a temporal change of the total mass of solid tin replenished to a reservoir by the refill mechanism.

FIG. 16 is a graph showing an example of a temporal change of the total mass M of the solid tin supplied to the reservoir 267 by the refill mechanism 91A. Assuming that the mass of the replenishment amount Qin per unit time is ΔM, ΔM2 becomes larger than ΔM1 with the elapse of time. In FIG. 16, time durations Δt1, Δt2 are the same. FIG. 16 shows an example in which the output amount Qout changes when the diameter d of the nozzle hole 268 or the output velocity of the target substance changes, and the replenishment amount Qin changes accordingly. In addition, assuming that the mass of the replenishment amount Qin per unit time Δt is ΔM and the density of liquid tin which is a material of the target substance in the reservoir 267 is ρ, the replenishment amount Qin can be calculated by following Equation (7).

[Equation 7]
$$Q_{in} = \frac{(\Delta M/\rho)}{\Delta t} \quad (7)$$

5.2 Operation

Figure 17:
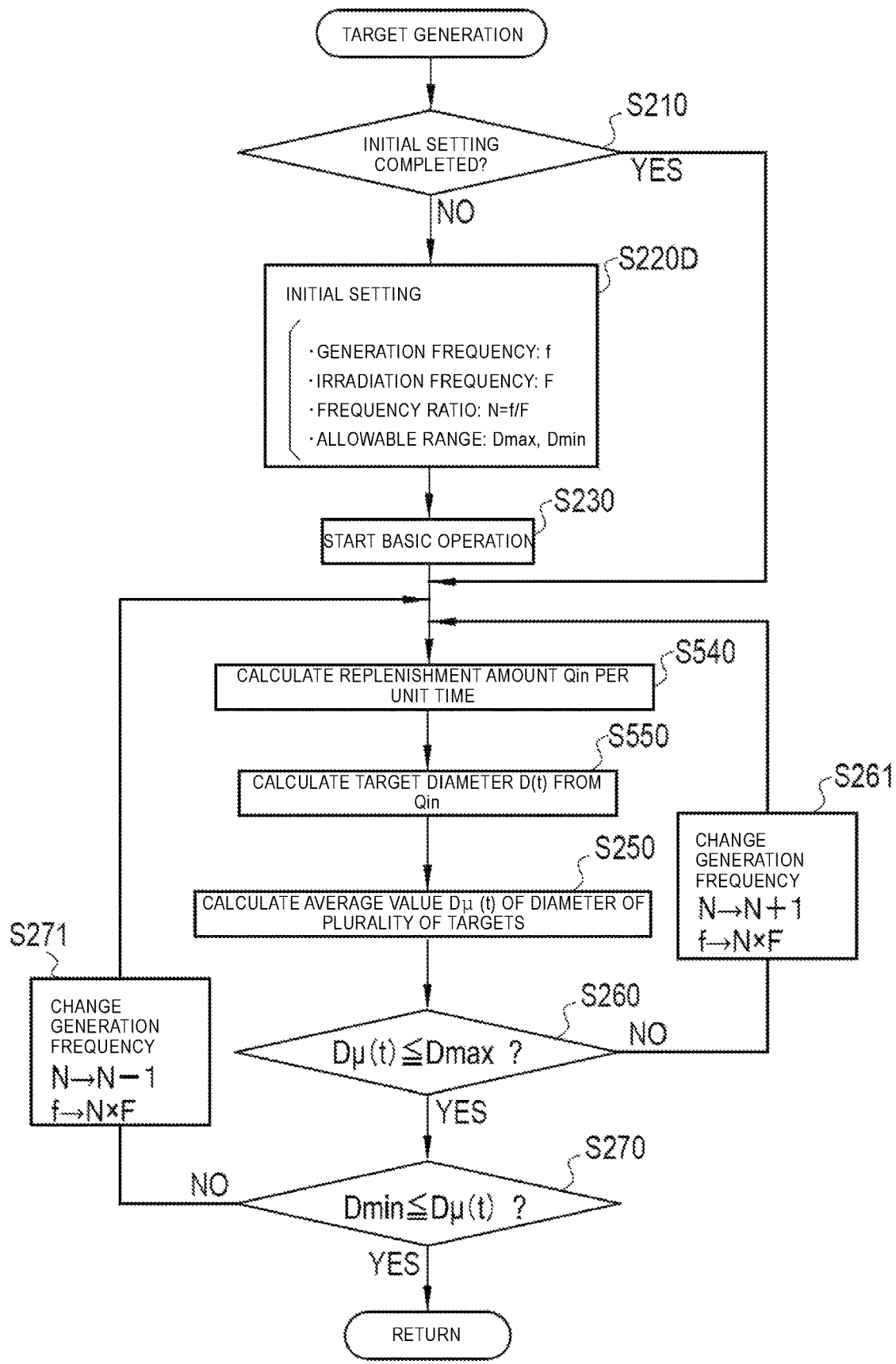
FIG. 17 is a flowchart showing the target generation process performed by the target generation processor based on the replenishment amount or the replenishment interval of target substance.

Next, with reference to the flowchart shown in FIG. 17, the operation of the EUV light generation apparatus of the third embodiment will be described. The flowchart shown in FIG. 17 is different from the flowchart of the first embodiment shown in FIG. 8 only in step S540 and step S550. Since the others are the same, the difference will be described.

In step S540, the target generation processor 52D measures the mass ΔM per unit time Δt by the measuring unit 96A, and calculates the replenishment amount Qin from ΔM based on Equation (7). After step S540, processing proceeds to step S550.

In step S550, the target generation processor 52D calculates the diameter D(t) of the target 27 at time t from the replenishment amount Qin based on Equation (6). Steps S250 and thereafter are the same as in the first embodiment, and the target generation processor 52D changes the generation frequency f based on the diameter D(t) of the target 27.

Modification of Third Embodiment

Figure 18:
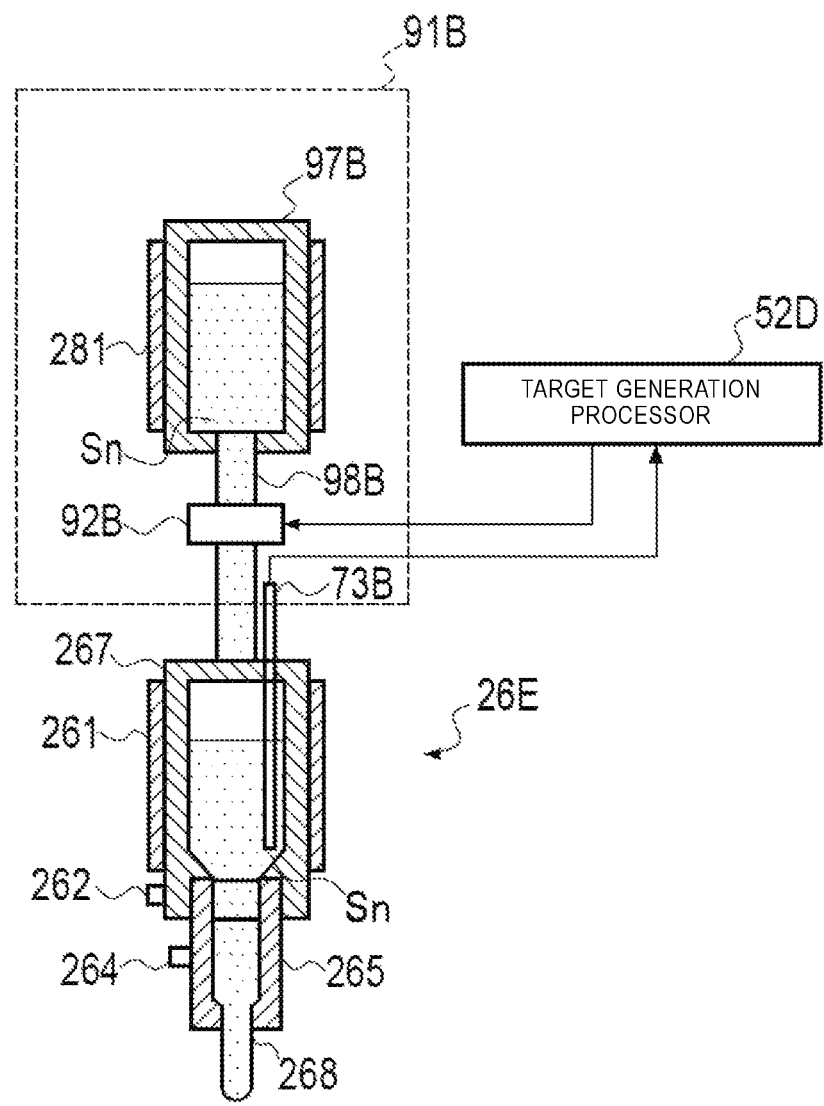
FIG. 18 is a diagram showing the configuration of the target supply unit including a refill mechanism different from that shown in FIG. 15.
Figure 19:
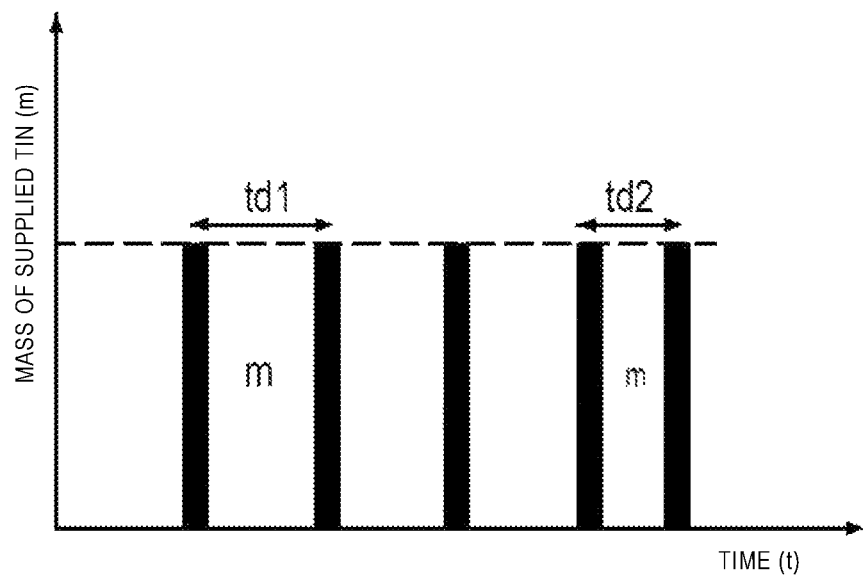
FIG. 19 is a graph showing a supply mass and a time interval when the target substance is liquid tin.

FIGS. 18 and 19 show a modification of the third embodiment. In the example shown in FIGS. 15 to 17, the diameter D of the target 27 is calculated from the replenishment amount Qin, but in the modification shown in FIGS. 18 and 19, the diameter D of the target 27 is calculated from the replenishment interval.

As shown in FIG. 18, a refill mechanism 91B of the modification includes a tank 97B, a heater 281, a pipe 98B, a valve 92B, and a liquid level sensor 73B. The tank 97B can be heated by the heater 281, and the target substance is contained in the tank 97B. The target substance is, for example, liquid tin. The tank 97B is connected to the reservoir 267 via the pipe 98B. The valve 92B for starting and stopping replenishment is arranged in the middle of the pipe 98B.

The target substance in the reservoir 267 is also liquid tin, and the liquid level sensor 73B detects the liquid level of the target substance in the reservoir 267. The liquid level sensor 73B is similar to the liquid level sensor 73A shown in FIG. 15 in having only one detection region for detecting the liquid level. However, unlike the liquid level sensor 73A shown in FIG. 15, the liquid level sensor 73B is arranged such that the detection region is located at a height of the lower limit of the liquid level of the liquid tin set in advance. The liquid level sensor 73B outputs a detection signal when the liquid level of the liquid tin is at the lower limit or higher, and does not output the detection signal when the liquid level of the liquid tin is lower than the lower limit. The refill mechanism 91B determines that the liquid level of the liquid tin in the reservoir 267 is lower than the lower limit when the detection signal from the liquid level sensor 73B is not received. When the liquid level becomes lower than the lower limit value, the refill mechanism 91B replenishes a preset amount of the target substance. The replenishment amount Qin of the refill mechanism 91B of one time is constant.

As shown in FIG. 19, even when the diameter d of the nozzle hole 268 or the like is changed in the modification, the mass m of the liquid tin corresponding to the replenishment amount Qin of one time is constant, but the replenishment interval td changes. FIG. 19 shows an example in which the replenishment interval td is shortened from td1 to td2 due to the increase of the diameter d of the nozzle hole 268.

In the case of the modification, the volume of the liquid tin corresponding to the replenishment amount Qin of one time can be calculated by dividing the mass m by the density ρ. The replenishment amount Qin of the modification is calculated by further dividing the calculated value of m/p by the replenishment interval td. The diameter D of the target 27 can be calculated by applying the replenishment amount Qin to Qin of Equation (6) described above. In other respects, the modification is similar to the flowchart of FIG. 17.

5.3 Effects

As described above, the EUV light generation apparatus of the third embodiment further includes the refill mechanism 91A, 91B that replenishes the target supply unit exemplified by the target supply unit 26D, 26E with the materials of the target 27, and the target generation processor 52D changes the generation frequency f based on the replenishment amount Qin of the refill mechanism 91A or the replenishment interval td of the refill mechanism 91B. The third embodiment is effective, for example, when the target image TP cannot be obtained as in the first embodiment.

The replenishment amount Qin is the replenishment amount Qin per unit time of the refill mechanism 91A, and the replenishment interval td is the replenishment interval td when the replenishment amount Qin of one time of the refill mechanism 91B is fixed. The target generation processor 52D calculates the size of the target 27 based on the replenishment amount Qin or the replenishment interval td. In the third embodiment, by converting the replenishment amount Qin or the replenishment interval td into the size of the target 27, the common portions of the first embodiment can be used.

Further, since the third embodiment uses the allowable range of the size of the target 27, the same effect as the example using the allowable range in the first embodiment is obtained.

Further, in the third embodiment, the size of the target 27 is measured from the replenishment amount Qin or the replenishment interval td, but the size of the target 27 may not be measured. For example, as in the second embodiment, the reference table recording the correspondence relationship between the replenishment amount Qin and the generation frequency f may be used, and the change control of the generation frequency f may be performed using the reference table. The replenishment amount Qin or the replenishment interval td correlates with the size of the target 27. Therefore, the replenishment amount Qin or the replenishment interval td is also an example of the "related information related to the size of the target" of the present disclosure.

6. EUV Light Generation Apparatus of Fourth Embodiment

Next, the EUV light generation apparatus of a fourth embodiment will be described. Any component same as that described above is denoted by an identical reference sign, and duplicate description thereof is omitted unless specific description is needed.

6.1 Configuration

Since the configuration of the EUV light generation apparatus according to the fourth embodiment is similar to that of the EUV light generation apparatus 1B according to the first embodiment, description thereof is omitted. The EUV light generation apparatus according to the fourth embodiment includes a target detection unit 41 that optically detects the target 27 moving from the target supply unit 26A toward the plasma generation region 25 and outputs a passage timing signal having a signal intensity corresponding to the size of the passing target 27. Since the entire configuration diagram of the EUV light generation apparatus according to the fourth embodiment is omitted, the target generation processor of the fourth embodiment is denoted by the same reference numeral as that of the first embodiment and will be described as the target generation processor 52B. As described below, the target generation processor 52B according to the fourth embodiment is different from the target generation processor 52B according to the first embodiment in the content of the change control of the generation frequency f. The target generation processor 52B of the fourth embodiment changes the generation frequency f based on the signal intensity. The target generation processor 52B is different from the EUV light generation apparatus 1B according to the first embodiment in that the generation frequency f of the target 27 is changed based on the signal intensity of the passage timing signal output by the target detection unit 41.

Figure 20:
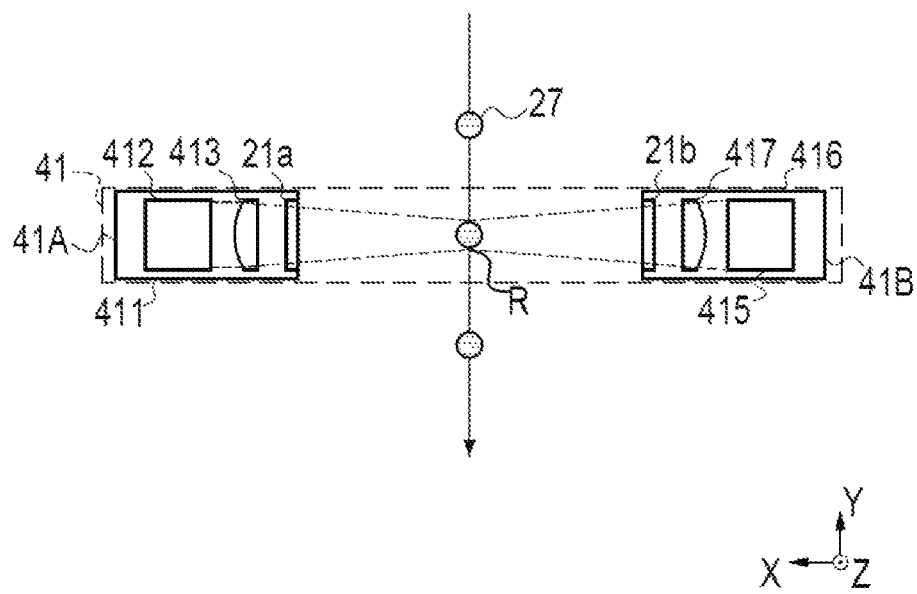
FIG. 20 is a diagram schematically showing a state in which the target passes through a target detection unit.

The fourth embodiment will be described with reference to FIGS. 20 to 22. FIG. 20 is a diagram schematically showing a state in which the target 27 passes through the target detection unit 41. As described in the first embodiment, the optical sensor 412 of the target detection unit 41 outputs a light receiving signal having a signal intensity corresponding to the amount of received light. When the target 27 passes through the target detection region R, the target 27 blocks the illumination light traveling from the light emitting unit 41B to the light receiving unit 41A, and thus the signal intensity of the light receiving signal that is the output of the optical sensor 412 changes. The target detection unit 41 detects the target 27 based on the change in the signal intensity when the target 27 passes therethrough.

Figure 21:
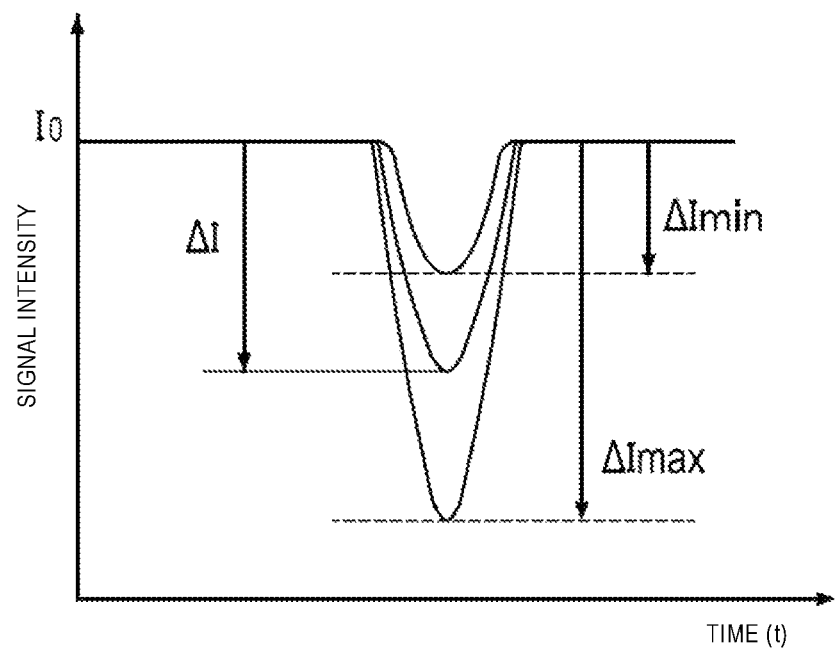
FIG. 21 is a graph showing the relationship between a signal intensity and time.

FIG. 21 is a graph showing a temporal change in the signal intensity I of the light receiving signal output from the optical sensor 412 when the target 27 passes through the target detection region R. In FIG. 21, the signal intensity $I_0$ is the signal intensity output by the optical sensor 412 when the target 27 is not passing, and the signal intensity $I_0$ is the baseline. Since the illumination light is not blocked by the target 27 when the target 27 is not passing, the signal intensity $I_0$ of the baseline indicates the maximum value of the signal intensity I. When the target 27 passes through the target detection region R, since a portion of the illumination light is blocked by the target 27, the signal intensity I decreases. As the size of the target 27 is larger, the signal intensity I decreases, and the amount of change ΔI from the signal intensity $I_0$ which is the baseline increases. On the other hand, as the size of the target 27 is smaller, the decrease in the signal intensity I is smaller, and the change amount ΔI from the signal intensity $I_0$ which is the base line decreases.

Since there is a correlation between the size of the target 27 and the magnitude of the change amount ΔI, the change amount ΔI is an example of the "related information related to the size of the target" in the present disclosure. In the fourth embodiment, the target generation processor 52B changes the generation frequency f based on the signal intensity I. Specifically, in this example, the change amount ΔI of the signal intensity I from the baseline is calculated, and the generation frequency f is changed based on the change amount ΔI.

In the fourth embodiment, the allowable range of the change amount ΔI is set in the memory 523 of the target generation processor 52B. As shown in FIG. 21, the lower limit value of the allowable range of the change amount ΔI is ΔImin, and the upper limit value is ΔImax.

6.2 Operation

Next, the operation of the EUV light generation apparatus according to the fourth embodiment will be described. Specifically, with reference to FIG. 22, the operation of the target generation processor 52B according to the fourth embodiment will be described.

Figure 22:
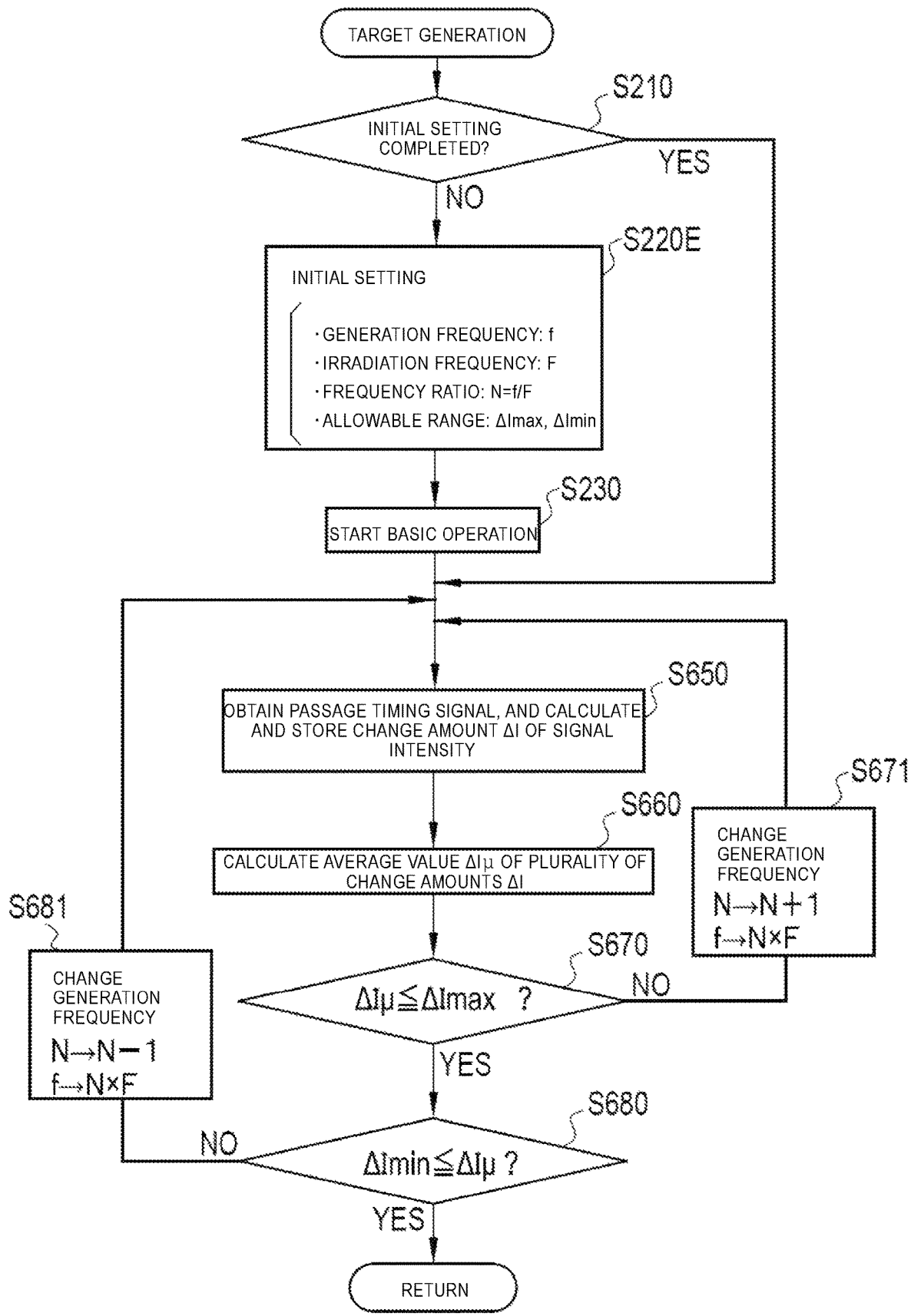
FIG. 22 is a flowchart showing the target generation process performed by the target generation processor based on the signal intensity of a passage timing signal.

FIG. 22 is a flowchart of the fourth embodiment. Step S210 and step S230 are similar to those in the first embodiment. In the fourth embodiment, in the initial setting of step S220E, the upper limit value ΔImax and the lower limit value ΔImin are read as the allowable range of the change amount ΔI.

When step S230 is completed, the target generation processor 52B performs the change control of the generation frequency fin step S650 and thereafter. In step S650, the target generation processor 52B obtains the passage timing signal for each target 27, and calculates the change amount ΔI of the signal intensity I from the baseline. The calculated change amount ΔI is stored in the memory 523.

In step S660, the target generation processor 52B calculates the average value ΔIµ of the plurality of change amounts ΔI for the plurality of targets 27.

In step S670, the target generation processor 52B compares the average value ΔIµ with the upper limit value ΔImax. When the average value ΔIµ exceeds the upper limit value (NO in step S670), it is considered that the target 27 is too large. In this case, the target generation processor 52B increases the generation frequency f. As a result, the size of the target 27 can be decreased. In step S670, when the average value ΔIµ is equal to or less than the upper limit value ΔImax (YES in step S670), processing proceeds to step S680.

In step S680, the target generation processor 52B compares the average value ΔIµ with the lower limit value ΔImin. When the average value ΔIµ is less than the lower limit value ΔImin (NO in step S680), it is considered that the target 27 is too small. In this case, the target generation processor 52B decreases the generation frequency f. As a result, the size of the target 27 can be increased. In step S680, when the average value ΔIµ is equal to or larger than the lower limit value (YES in step S680), processing returns to step S30 of FIG. 4 without changing the generation frequency f.

6.3 Effects

As described above, the EUV light generation apparatus of the fourth embodiment includes the target detection unit 41 for detecting the passage timing signal, and includes the target generation processor 52B that changes the generation frequency f based on the signal intensity I of the passage timing signal of the target 27. Therefore, the fourth embodiment is effective when the size of the target 27 cannot be measured from the target image TP.

In the fourth embodiment, the allowable range is used as shown in FIG. 22. Therefore, the effect of using the allowable range is obtained similarly as in the first embodiment. In the fourth embodiment, the representative value of the change amount ΔI of the plurality of signal intensities I is compared with the upper limit value Imax or the lower limit value Imin of the allowable range. Accordingly, the same effect therewith as in the first embodiment is also obtained.

In the fourth embodiment, an example has been described in which the change amount ΔI of the signal intensity I is used as the related information, and the generation frequency f is changed based on the change amount ΔI. However, the generation frequency f may be changed using a reference table in which the correspondence relationship between the signal intensity I or the change amount ΔI and the generation frequency f is recorded.

7. EUV Light Generation Apparatus of Fifth Embodiment

Next, an EUV light generation apparatus 1F of a fifth embodiment will be described. Any component same as that described above is denoted by an identical reference sign, and duplicate description thereof is omitted unless specific description is needed.

7.1 Configuration

Figure 23:
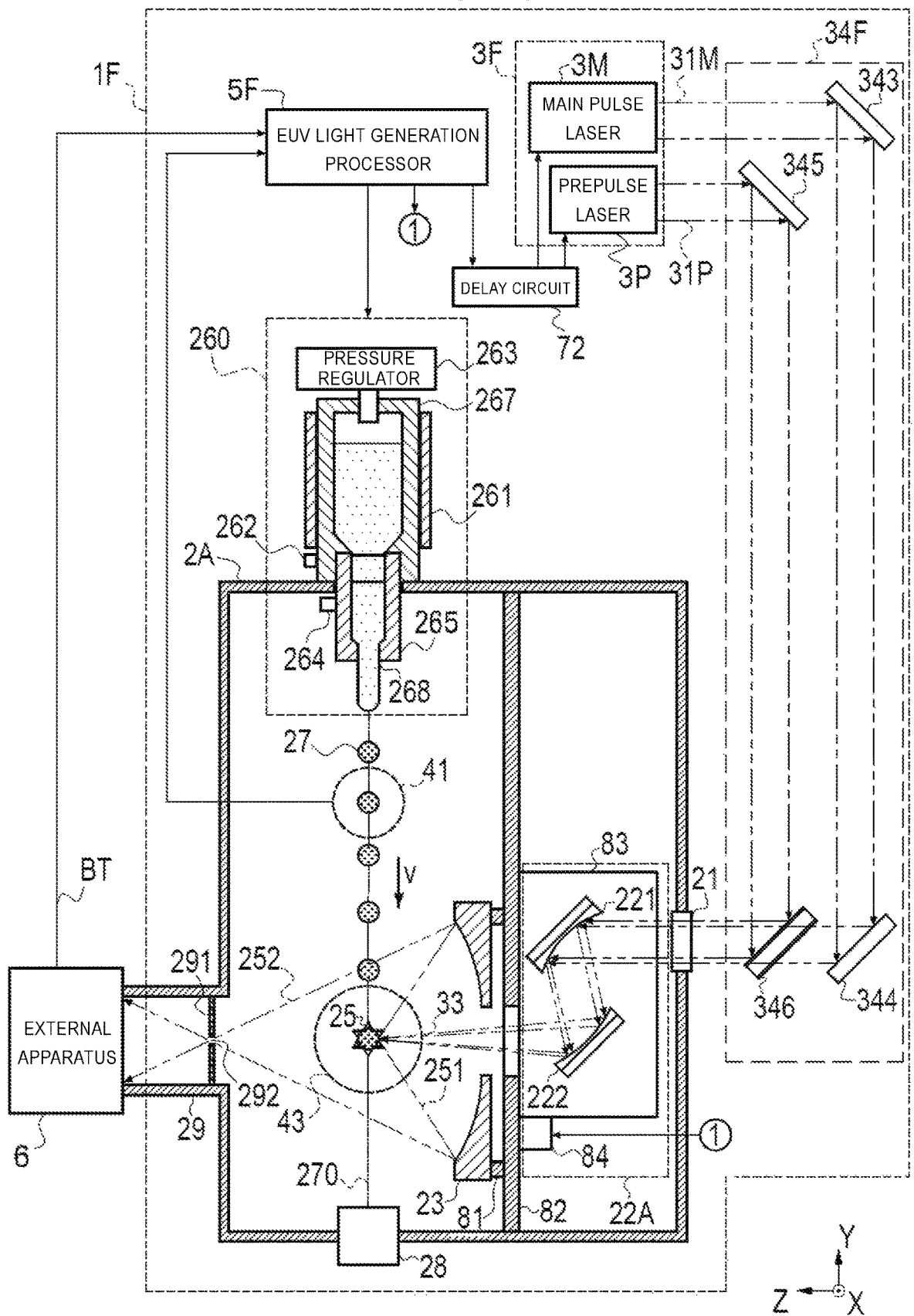
FIG. 23 schematically shows the configuration of the EUV light generation system according to a fifth embodiment.

FIG. 23 is a diagram schematically showing the configuration of the EUV light generation apparatus 1F according to the fifth embodiment. The EUV light generation apparatus 1F according to the fifth embodiment is different from the EUV light generation apparatus 1B according to the first embodiment in that a laser device 3F and a laser light travel direction control unit 34F are arranged instead of the laser device 3A and the laser light travel direction control unit 34A.

The laser device 3F includes a prepulse laser 3P and a main pulse laser 3M. The prepulse laser 3P is configured to output prepulse laser light 31P. The main pulse laser 3M is configured to output main pulse laser light 31M. The prepulse laser 3P is, for example, a YAG laser device or a laser device using Nd:YVO4. The main pulse laser 3M is, for example, a $CO_2$ laser device. The main pulse laser 3M may be a YAG laser device or a laser device using Nd:YVO4.

The laser light travel direction control unit 34F includes high reflection mirrors 343, 344, 345 and a combiner 346. The high reflection mirrors 343, 344 are arranged on an optical path of the main pulse laser light 31M. The high reflection mirror 345 is arranged on an optical path of the prepulse laser light 31P.

The combiner 346 is located on an optical path of the prepulse laser light 31P reflected by the high reflection mirror 345 and an optical path of the main pulse laser light 31M reflected by the high reflection mirror 344. The combiner 346 is configured to reflect the prepulse laser light 31P at high reflectance and transmit the main pulse laser light 31M at high transmittance. The high reflection mirror 344 and the combiner 346 are configured to reflect the main pulse laser light 31M and the prepulse laser light 31P toward the inside of the chamber 2A. The combiner 346 is configured to substantially cause the optical path axes of the prepulse laser light 31P and the main pulse laser light 31M to be matched to each other.

Figure 24:
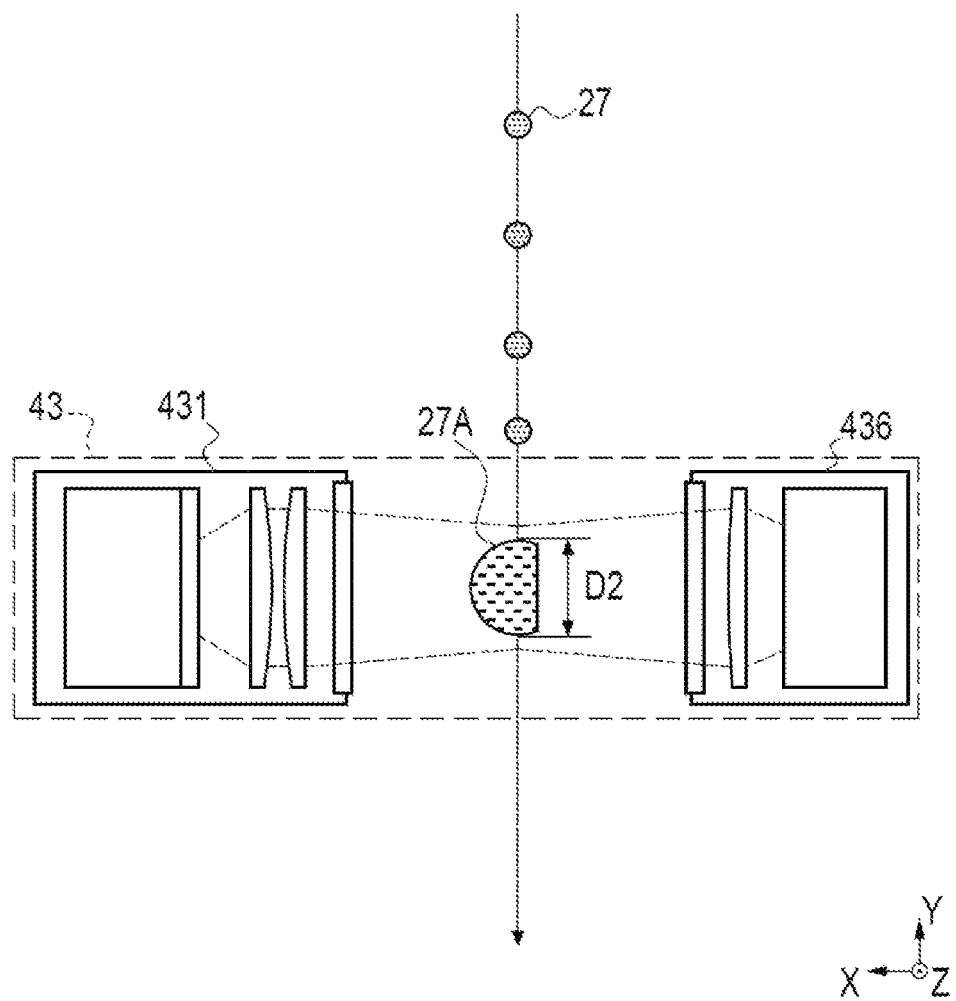
FIG. 24 is a diagram schematically showing a state in which an image measurement unit detects the target in a mist form.

The fifth embodiment includes the image measurement unit 43 similar to that of the first embodiment. FIG. 24 is a diagram schematically showing a state in which the image measurement unit 43 detects the target in a mist form. The image measurement unit 43 images, instead of the target 27 in the droplet form as in the first embodiment, a target 27A in the mist form that has been irradiated with the prepulse laser light 31P and has become in the diffused state. The target generation processor 52B measures the size of the target 27A in the mist form from the target image TP using the target image TP output from the image measurement unit 43. The other points are the same as those of the first embodiment.

7.2 Operation

Next, the operation of the EUV light generation apparatus IF according to the fifth embodiment is substantially the same as that of the first embodiment. The difference is that the generation frequency f is changed based on the diameter D of the target 27 in the droplet form in the first embodiment, whereas the generation frequency f is changed based on the diameter D of the target 27A in the mist form in the fifth embodiment.

7.3 Effects

The EUV light generation apparatus IF according to the fifth embodiment can also obtain the same effects as those of the first embodiment. The fifth embodiment may be combined with any of the second to fourth embodiments.

8. Others

Figure 25:
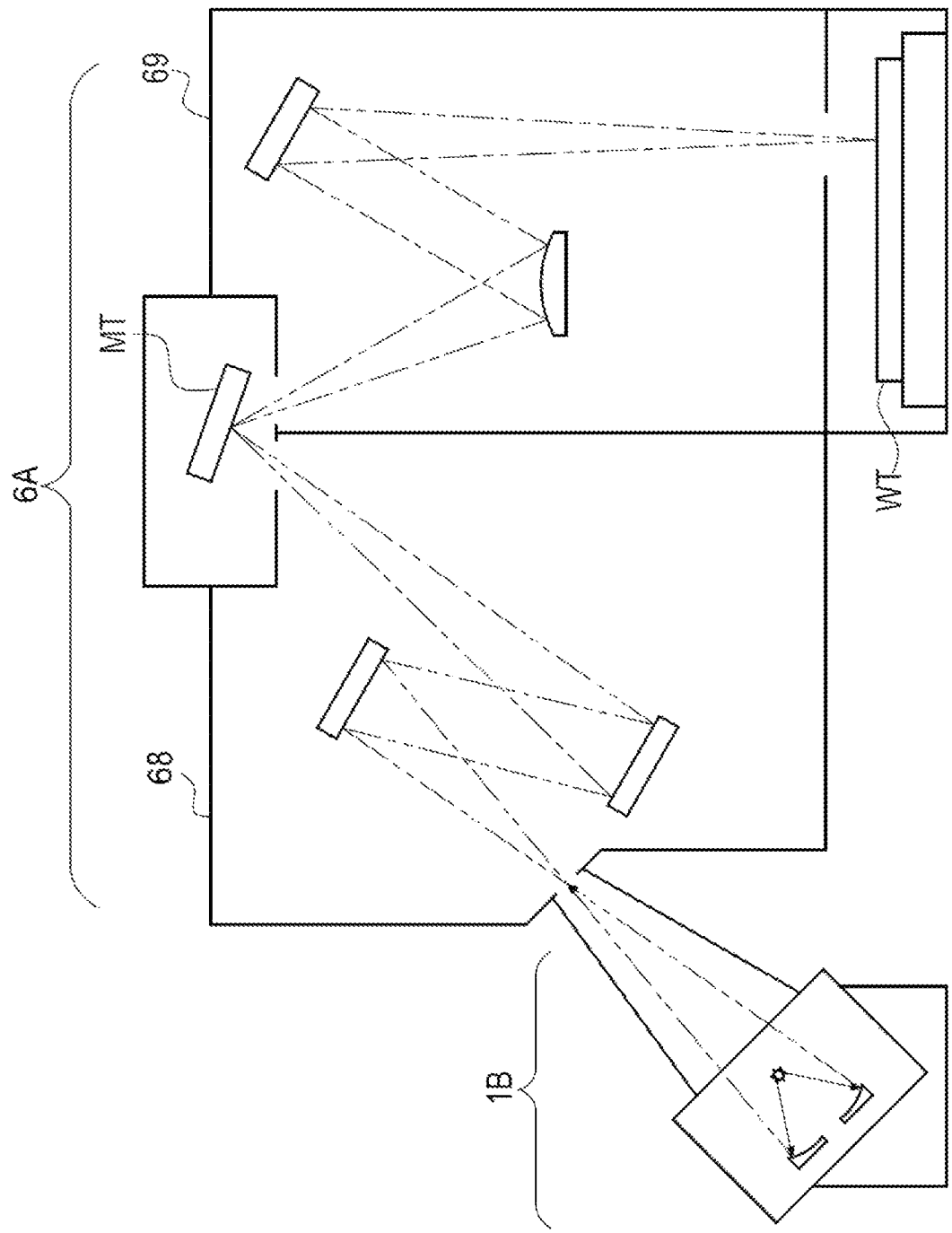
FIG. 25 schematically shows the configuration of an exposure apparatus connected to the EUV light generation apparatus.

FIG. 25 schematically shows the configuration of an exposure apparatus 6A connected to the EUV light generation apparatus 1B. In FIG. 24, the exposure apparatus 6A as the external apparatus 6 includes a mask irradiation unit 68 and a workpiece irradiation unit 69. The mask irradiation unit 68 illuminates, via a reflection optical system, a mask pattern of the mask table MT with the EUV light incident from the EUV light generation apparatus 1B. The workpiece irradiation unit 69 images the EUV light reflected by the mask table MT onto a workpiece (not shown) arranged on a workpiece table WT via the reflection optical system. The workpiece is a photosensitive substrate such as a semiconductor wafer on which photoresist is applied. The exposure apparatus 6A synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured.

Figure 26:
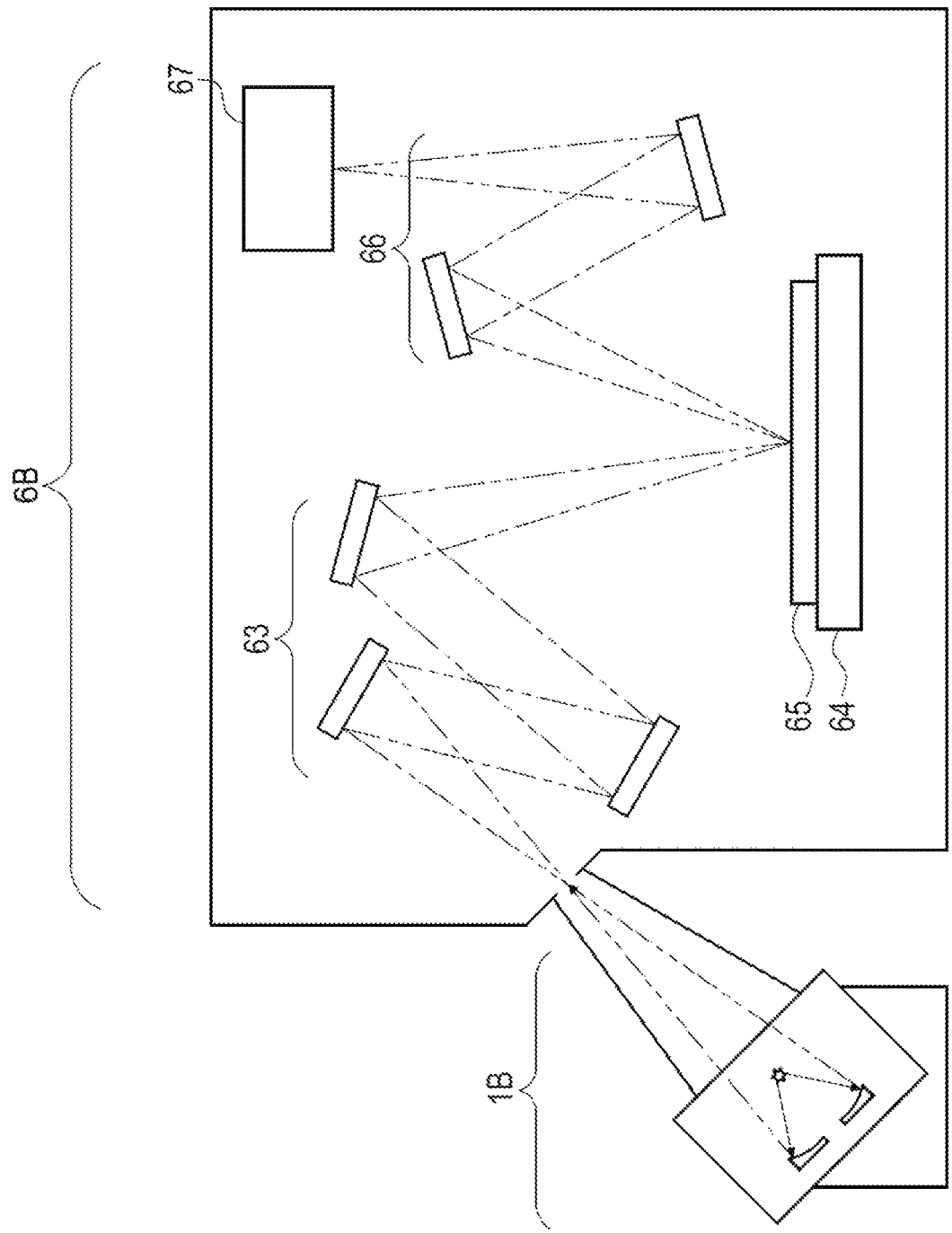
FIG. 26 schematically shows the configuration of an inspection apparatus connected to the EUV light generation apparatus.

FIG. 26 schematically shows the configuration of an inspection apparatus 6B connected to the EUV light generation apparatus 1B. In FIG. 26, the inspection apparatus 6B as the external apparatus 6 includes an illumination optical system 63 and a detection optical system 66. The EUV light generation apparatus 1B outputs, as a light source for inspection, EUV light to the inspection apparatus 6B. The illumination optical system 63 reflects the EUV light incident from the EUV light generation apparatus 1B to illuminate a mask 65 placed on a mask stage 64. Here, the mask 65 conceptually includes a mask blanks before a pattern is formed. The detection optical system 66 reflects the EUV light from the illuminated mask 65 and forms an image on a light receiving surface of a detector 67. The detector 67 having received the EUV light obtains the image of the mask 65. The detector 67 is, for example, a time delay integration (TDI) camera. Defects of the mask 65 are inspected based on the image of the mask 65 obtained by the above-described process, and a mask suitable for manufacturing an electronic device is selected using the inspection result. Then, the electronic device can be manufactured by exposing and transferring the pattern formed on the selected mask onto the photosensitive substrate using the exposure apparatus 6A.

In the inspection apparatus 6B, the above-described EUV light concentrating mirror 23 may be a grazing incidence type. Further, in FIGS. 25 and 26, instead of the EUV light generation apparatus 1B, any one of the EUV light generation apparatus of the second to fifth embodiments may be used.

The description above is intended to be illustrative and the present disclosure is not limited thereto. Therefore, it would be obvious to those skilled in the art that various modifications to the embodiments of the present disclosure would be possible without departing from the spirit and the scope of the appended claims.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An EUV light generation apparatus configured to generate EUV light by irradiating a target with pulse laser light to turn the target into plasma, the EUV light generation apparatus comprising:
   a chamber;
   a target supply unit configured to supply the target to a plasma generation region in the chamber;
   a pulse laser device configured to generate pulse laser light to be radiated to the target; and
   a processor configured to change a generation frequency of the target generated by the target supply unit to a natural number multiple of an irradiation frequency of the pulse laser light based on a size of the target or related information related to the size of the target.

2. The EUV light generation apparatus according to claim 1,
   further comprising an image measurement unit configured to image the target and output a target image,
   wherein the processor measures the size of the target from the target image.

3. The EUV light generation apparatus according to claim 2,
   wherein an allowable range of the size of the target is set in advance, and
   the processor increases the generation frequency when the size of the target exceeds an upper limit value of the allowable range, and decreases the generation frequency when the size of the target falls below a lower limit value of the allowable range.

4. The EUV light generation apparatus according to claim 3,
wherein the processor compares a representative value of the measured size of a plurality of the targets with the upper limit value or the lower limit value.

5. The EUV light generation apparatus according to claim 1,
further comprising an elapsed time measurement unit configured to measure an elapsed time from a preset time point,
wherein the processor changes the generation frequency based on the elapsed time.

6. The EUV light generation apparatus according to claim 5,
wherein the elapsed time is a cumulative value of an operation time of the target supply unit.

7. The EUV light generation apparatus according to claim 6,
wherein the processor increases the generation frequency as the elapsed time increases.

8. The EUV light generation apparatus according to claim 6,
further comprising a storage device in which correspondence relationship between a plurality of reference times compared with the elapsed time and a plurality of generation frequencies set corresponding to the plurality of reference times,
wherein the processor changes the generation frequency according to the elapsed time with reference to the correspondence relationship.

9. The EUV light generation apparatus according to claim 1,
further comprising a refill mechanism configured to replenish the target supply unit with a material of the target,
wherein the processor changes the generation frequency based on a replenishment amount or a replenishment interval of the refill mechanism.

10. The EUV light generation apparatus according to claim 9,
wherein the replenishment amount is a replenishment amount per unit time of the refill mechanism,
the replenishment interval is a replenishment interval when a replenishment amount of one time of the refill mechanism is fixed, and
the processor calculates the size of the target based on the replenishment amount or the replenishment interval.

11. The EUV light generation apparatus according to claim 10,
wherein an allowable range of the size of the target is set in advance, and
the processor increases the generation frequency when the calculated size of the target exceeds an upper limit value of an allowable range, and decreases the generation frequency when the size of the target falls below a lower limit value of the allowable range.

12. The EUV light generation apparatus according to claim 1,
further comprising a target detection unit configured to optically detect the target moving from the target supply unit toward the plasma generation region and outputs a passage timing signal having a signal intensity corresponding to the size of the target,
wherein the processor changes the generation frequency based on the signal intensity.

13. The EUV light generation apparatus according to claim 12,
wherein the related information is the signal intensity,
an allowable range of a change amount of the signal intensity from a baseline is set in advance, and
the processor increases the generation frequency when the change amount exceeds an upper limit value of an allowable range, and decreases the generation frequency when the change amount falls below a lower limit value of the allowable range.

14. The EUV light generation apparatus according to claim 13,
wherein the processor measures the change amount a plurality of times and compares a representative value of the measured change amounts with the upper limit value or the lower limit value.

15. The EUV light generation apparatus according to claim 1,
wherein the target is a droplet form target, and
the size of the target is a size of the droplet form target generated by the target supply unit.

16. The EUV light generation apparatus according to claim 1,
wherein the pulse laser device generates prepulse laser light and main pulse laser light as the pulse laser light, and
after the target having a droplet shape generated by the target supply unit is irradiated with the prepulse laser light, a mist form target in which the target is in a diffused state owing to the irradiation with the prepulse laser light is irradiated with the main pulse laser light.

17. The EUV light generation apparatus according to claim 16,
further comprising an image measurement unit configured to image the mist form target and output a target image,
wherein the processor measures the size of the mist form target from the target image and changes the generation frequency based on the size of the mist form target.

18. The EUV light generation apparatus according to claim 17,
wherein an allowable range of the size of the target is set in advance, and
the processor increases the generation frequency when the size of the mist form target exceeds an upper limit value of the allowable range, and decreases the generation frequency when the size of the mist form target falls below a lower limit value of the allowable range.

19. An electronic device manufacturing method, comprising:
generating EUV light as turning a target into plasma by irradiating the target with pulse laser light using an EUV light generation apparatus,
outputting the EUV light to an exposure apparatus; and
exposing a photosensitive substrate to the EUV light in the exposure apparatus to manufacture an electronic device,
the EUV light generation apparatus, including:
a chamber;
a target supply unit configured to supply the target to a plasma generation region in the chamber;
a pulse laser device configured to generate the pulse laser light to be radiated to the target; and
a processor configured to change a generation frequency of the target to a natural number multiple of an irradiation frequency of the pulse laser light based on a size of the target.

20. An inspection method, comprising:
generating EUV light as turning a target into plasma by irradiating the target with pulse laser light using an EUV light generation apparatus,
outputting the EUV light to an inspection apparatus as a light source for inspection; and
exposing a mask to the EUV light to inspect the mask in the inspection apparatus,
the EUV light generation apparatus, including:
a chamber;
a target supply unit configured to supply the target to a plasma generation region in the chamber;
a pulse laser device configured to generate the pulse laser light to be radiated to the target; and
a processor configured to change a generation frequency of the target to a natural number multiple of an irradiation frequency of the pulse laser light based on a size of the target.

\* \* \* \* \*